(12) United States Patent
Watt

(10) Patent No.: US 6,411,494 B1
(45) Date of Patent: Jun. 25, 2002

(54) DISTRIBUTED CAPACITOR

(75) Inventor: Michael Man-Kuen Watt, North York (CA)

(73) Assignee: Gennum Corporation, Burlington (CA)

( * ) Notice: Subject to any disclaimer, the term of this patent is extended or adjusted under 35 U.S.C. 154(b) by 0 days.

(21) Appl. No.: 09/544,550

(22) Filed: Apr. 6, 2000

(51) Int. Cl.$^7$ ................................................ H01G 4/228

(52) U.S. Cl. ................................ 361/306.3; 361/306.1; 361/311; 361/313

(58) Field of Search ............................. 361/301.4, 313, 361/306.1, 619, 691, 393, 278, 311, 328

(56) References Cited

U.S. PATENT DOCUMENTS

| | | | |
|---|---|---|---|
| 3,648,132 A | 3/1972 | Rayburn | 317/261 |
| 4,148,003 A | 4/1979 | Colburn et al. | 333/181 |
| 4,419,713 A | 12/1983 | Levinson | 361/321 |
| 4,470,099 A | 9/1984 | Sawairi | 361/328 |
| 4,723,194 A | 2/1988 | Nakamura et al. | 361/330 |
| 4,789,840 A | 12/1988 | Albin | 329/161 |
| 4,914,546 A | 4/1990 | Alter | 361/313 |
| 4,916,576 A | 4/1990 | Herbert et al. | 361/313 |
| 4,969,032 A | 11/1990 | Scheitlin et al. | 357/22 |
| 5,040,091 A | 8/1991 | Yamaoka et al. | 361/302 |
| 5,144,527 A | 9/1992 | Amano et al. | 361/321 |
| 5,177,670 A | 1/1993 | Shinohara et al. | 057/20 |
| 5,191,510 A | 3/1993 | Huffman | 361/313 |
| 5,206,788 A * | 4/1993 | Larson et al. | 361/313 |
| 5,283,462 A | 2/1994 | Stengel | 257/595 |
| 5,367,430 A | 11/1994 | DeVoe et al. | 361/328 |
| 5,414,588 A | 5/1995 | Barbee, Jr. et al. | 361/304 |
| 5,457,598 A | 10/1995 | Radford et al. | 361/321 |

(List continued on next page.)

FOREIGN PATENT DOCUMENTS

| | | | |
|---|---|---|---|
| EP | 0262 493 A2 | 11/1987 | ........ H01L/23/56 |
| JP | 03-012909 | 1/1991 | |
| JP | 04-207011 | 7/1992 | |
| JP | 06-013258 | 1/1994 | |
| JP | 06-231991 | 8/1994 | |
| JP | 06-342736 | 12/1994 | |

*Primary Examiner*—Dean A. Reichard
*Assistant Examiner*—Nguyen T Ha
(74) *Attorney, Agent, or Firm*—Bereskin & Parr

(57) ABSTRACT

A multi-layer distributed capacitor structure comprises a bottom electrode layer overlying a monolithic substrate, intermediate pairs of layers of film electrode and dielectric material overlying the bottom electrode, and a top pair of layers of a film electrode and dielectric material overlying the intermediate pairs. The structure contains multiple openings, each opening extending from the top pair of layers through the intermediate layers and optionally through said bottom electrode. Each electrode layer also extends laterally beyond and around the entire periphery of the layers positioned above such that the electrode layers bordering on each opening has edges running along the perimeter of the opening which are left exposed for electrical connection to a circuit using wire interconnects. Accordingly, electrode layers can be selectively accessed through openings to provide local decoupling capacitance to the power supply and ground nodes of an integrated circuit flip-chip mounted on the top surface of the structure. Since local electrical connections can be made between the electrode layers within each opening and the integrated circuit logic gates, lead inductance and equivalent series resistance is significantly reduced, effecting improved switching noise reduction. Further, the structure can be configured as a power distribution circuit for an integrated circuit by directly connecting the electrode layers of structure to a circuit power supply and ground through integrated circuit package leads. Since the electrode layers of structure represent substantially planar power and ground planes, this arrangement results in additional reductions in inductance and resistance of the electrical path.

14 Claims, 21 Drawing Sheets

U.S. PATENT DOCUMENTS

| | | | |
|---|---|---|---|
| 5,486,277 A | 1/1996 | Barbee, Jr. et al. | 204/192.15 |
| 5,583,359 A | 12/1996 | Ng et al. | 257/306 |
| 5,629,655 A | 5/1997 | Dent | 333/172 |
| 5,636,099 A | 6/1997 | Sugawara et al. | 361/278 |
| 5,739,576 A | 4/1998 | Shirley et al. | 257/532 |
| 5,745,335 A * | 4/1998 | Watt | 361/313 |
| 5,786,630 A | 7/1998 | Bhansali et al. | 257/697 |
| 5,789,807 A * | 8/1998 | Correale, Jr. | 257/691 |
| 5,905,627 A | 5/1999 | Brendel et al. | 361/302 |
| 6,098,282 A * | 8/2000 | Frankeny et al. | 29/852 |

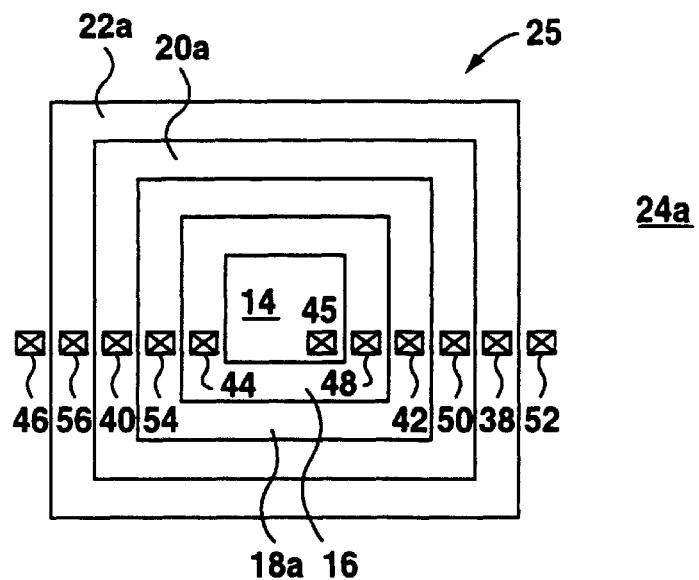
FIG. 3
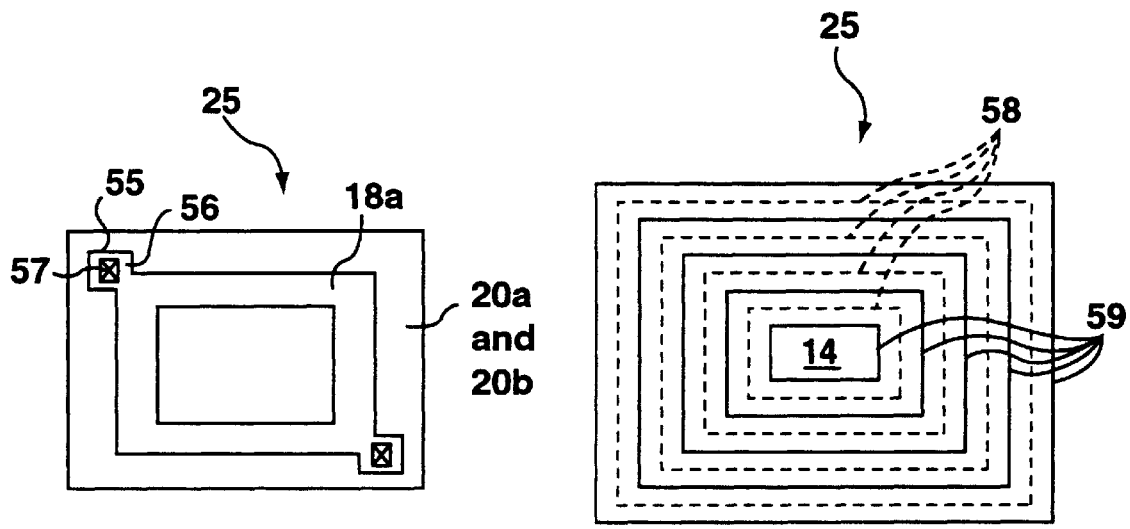
FIG. 5
FIG. 6

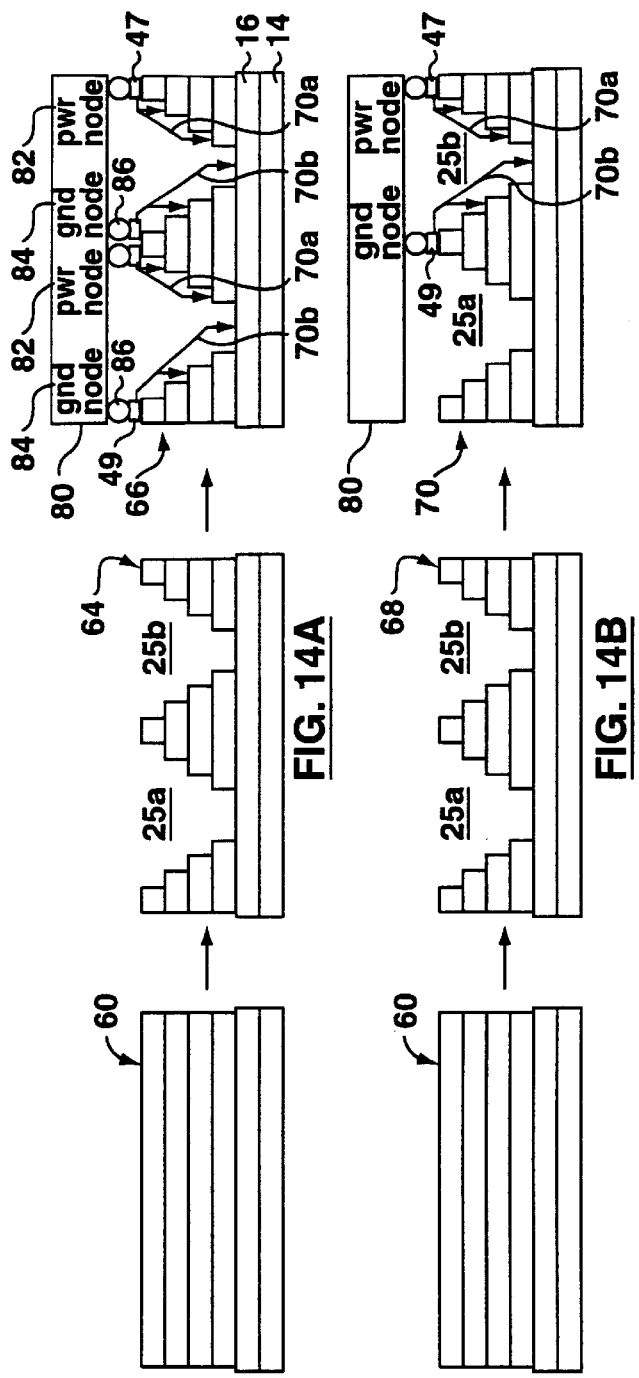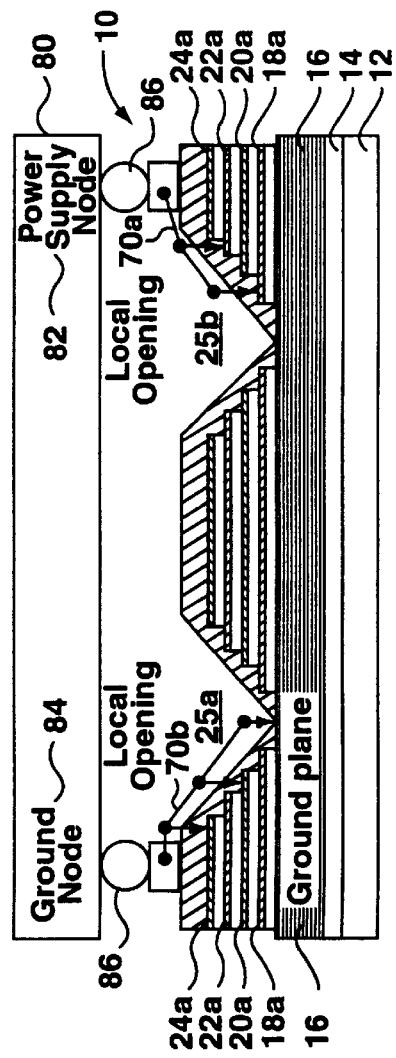

DISTRIBUTED CAPACITOR

FIELD OF THE INVENTION

This invention relates to multi-layer capacitor structures, and to methods for forming the same.

BACKGROUND OF THE INVENTION

As the complexity of integrated circuits increases, logic devices are switched at ever increasing rates to increase device performance. However, digital integrated circuits require both stable voltage references and uniform power distribution among all integrated logic devices for signal definition. Higher switching rates result in increased amounts of associated electrical switching noise, which can substantially affect the stability and the uniformity of the operational voltages associated with each logic device.

It is well known that switching noise of a circuit stage can be reduced by minimizing the inductance as well as maximizing the capacitance, of the electrical path that exists between the power and ground terminals. Capacitors are generally used to reduce power supply and ground supply noise and to improve the switching speed by providing necessary transient currents during a switching event. When these capacitors discharge their current into the device, they quickly recharge from energy stored in slower discharging capacitors and power supplies. However, current capacitive methods and structures for reducing noise on an integrated circuit are not always adequate, especially at higher frequencies of operation.

For example, one known technique for reducing switching noise is to utilize a decoupling capacitor between associated voltage pins. However, since a discrete capacitor is necessarily mounted a certain distance away from the semiconductor chip, it is electrically coupled to the voltage pins by a plurality of power wiring lines or large power buses which typically represent high induction paths which add to the effective inductance of the electrical path. Further, as the amount of current flowing in the plurality of wiring lines increases, a voltage drop is produced across the wires which adds additional power distribution noise. Also, in such a configuration, a significant amount of resistance exists between the capacitor and the switching logic which reduces the amount of transient current the capacitor can provide, which limits its noise suppression capability, and which slows down the speed of the switching circuits.

One technique of minimizing the effective inductance of the electrical paths is to move the decoupling capacitor as close to the semiconductor chip as possible. However, in view of either the layout of the wiring lines associated with the semiconductor chip and/or the physical dimensions of the discrete capacitor itself, it is not possible to physically position the discrete capacitor so that there is no voltage drop or switching noise. Further, externally mounted decoupling capacitors occupy considerable surface area, increase the overall cost of a completed integrated circuit unit, and the assembly of a number of individual capacitors can be cumbersome and prone to error.

An alternative capacitive structure which is used to reduce switching noise is discussed in U.S. Pat. No. 4,916,576 to Herbert. This patent describes a multipin matrix capacitor having a plurality of distributed terminals along each electrode to provide shorter conduction path lengths between an external component and the capacitor to reduce capacitive lead inductances. However, the conduction path lengths between the external component and the capacitor are limited by the fact that connections to the capacitor structure can only be made around the outside edges of the capacitive element. Further, since the capacitor is not manufactured integral with the external component, it is isolated by the board and package inductance, which severely reduces its effectiveness in reducing switching noise.

Another method of providing decoupling capacitance within an integrated circuit is described in U.S. Pat. No. 5,789,807 to Correale, Jr. This patent discloses a power conductor structure which staggers power and ground conductors such that a first power connector in one outer plane is connected to a second power conductor in the other outer plane that is displaced vertically and laterally from the first power conductor. The resulting structure improves power supply decoupling by providing increased capacitance associated with the power distribution of the integrated circuit. However, since the individual power and ground conductors are formed as a wire grid, they do not have the capacitive character of substantially planar ground planes. Further, since the power and ground conductors also carry chip-level voltage signals, low-dielectric constant materials will be disposed between the conductors. The resulting decoupling capacitance provided across the integrated circuit is likely to be insufficient to suppress the high levels of noise which occur at high frequencies and as a result, additional decoupling capacitors may be required.

Accordingly, there is a need for an improved distributed high density capacitive structure which can be used to provide locally accessible capacitance to various switching logic gates resident on an integrated circuit, which introduces substantially low levels of inductance and resistance into the electric path, and which is easy to fabricate and customize for high frequency application.

BRIEF SUMMARY OF THE INVENTION

It is therefore an object of the present invention, to provide a multi-layer distributed capacitance structure comprising:

(a) a substrate, and a bottom electrode layer overlying said substrate, (b) at least one pair of intermediate layers of an electrode and a dielectric material overlying said bottom electrode, (c) a top pair of layers of an electrode and a dielectric material overlying the uppermost pair of intermediate layers, (d) a plurality of openings in said structure, each opening extending from said top pair of layers and through at least one pair of said intermediate layers, at least some of said openings penetrating all of said pairs of intermediate layers, (e) each opening having a sidewall, at least a portion of said sidewall having an inwardly and downwardly stepped configuration in said opening so that at least some of said layers of electrodes in said openings have edge portions in said openings that are not covered by an electrode layer thereabove, and (f) at least some of said edge portions being adapted to be connected to a circuit.

In another aspect the invention provides a method for fabricating a multi-layer film capacitor structure, comprising the steps of:

(a) providing a substrate, (b) establishing a bottom electrode layer over said substrate, (c) establishing at least one pair of intermediate layers of an electrode and a dielectric material over said bottom electrode, (d) establishing a top pair of an electrode and a dielectric material over said intermediate layers, and (e) removing portions of said electrode and dielectric material layers such that a plurality of openings are formed in said structure, each said opening extending from said top pair of layers and through at least one pair of said intermediate layers with at least some of said openings penetrating all of said pairs of intermediate layers.

In another aspect the invention provides a method of fabricating a multi-layer distributed capacitor structure, comprising the steps of.

(a) providing a substrate, (b) establishing a bottom electrode layer over said substrate, (c) establishing at least one pair of intermediate layers of an electrode and a dielectric material over said bottom electrode, (d) establishing a top pair of an electrode and a dielectric material over said intermediate layers, and (e) such that said electrode and dielectric material layers together form a structure having a plurality of openings, each said opening extending from said top pair of layers and through at least one pair of said intermediate layers with at least some of said openings penetrating all of said pairs of intermediate layers.

Further objects and advantages of the invention will appear from the following description, taken together with the accompanying drawings.

BRIEF DESCRIPTION OF THE DRAWINGS

In the accompanying drawings:

FIG. 3 is a top view of a staircase opening of the distributed capacitance structure of FIG. 1 showing alternate positions for electrical contact;

FIG. 5 is a top view of a modified pair of dielectric and electrode layers;

FIG. 6 is a top view of a staircase opening which illustrates manufacturing tolerances;

FIGS. 12A-1 and 12A-2 are a diagrammatic side and top view, respectively, of a plurality of individual capacitance structures of FIG. 1, each individually flip-chip connected to the top surface of a common integrated circuit;

FIGS. 12B-1 and 12B-2 are a diagrammatic side and top view, respectively,, a plurality of independent capacitances structures of FIG. 1 formed on a single substrate, each individually flip-chip connected to the top surface of a common integrated circuit;

FIGS. 12C-1 and 12C-2 are a diagrammatic side and top view, respectively of a plurality of individual integrated circuits, each individually flip-chip connected to the top surface of the capacitance structure of FIG. 1;

FIG. 14A shows a sequence of product manufacturing steps from production of an unpatterned blanket structure to production of a custom distributed capacitance structure to production of a custom wired product;

FIG. 14B shows a sequence of product manufacturing steps from an unpatterned blanket structure to production of a stock staircase opening array to the production of a custom wired product;

FIG. 15 is a diagrammatic side sectional view of a custom wired product wherein each staircase opening is electrically exclusively connected to one of a power supply and ground node of a logic gate;

DETAILED DESCRIPTION OF PREFERRED EMBODIMENTS

Figure 1:
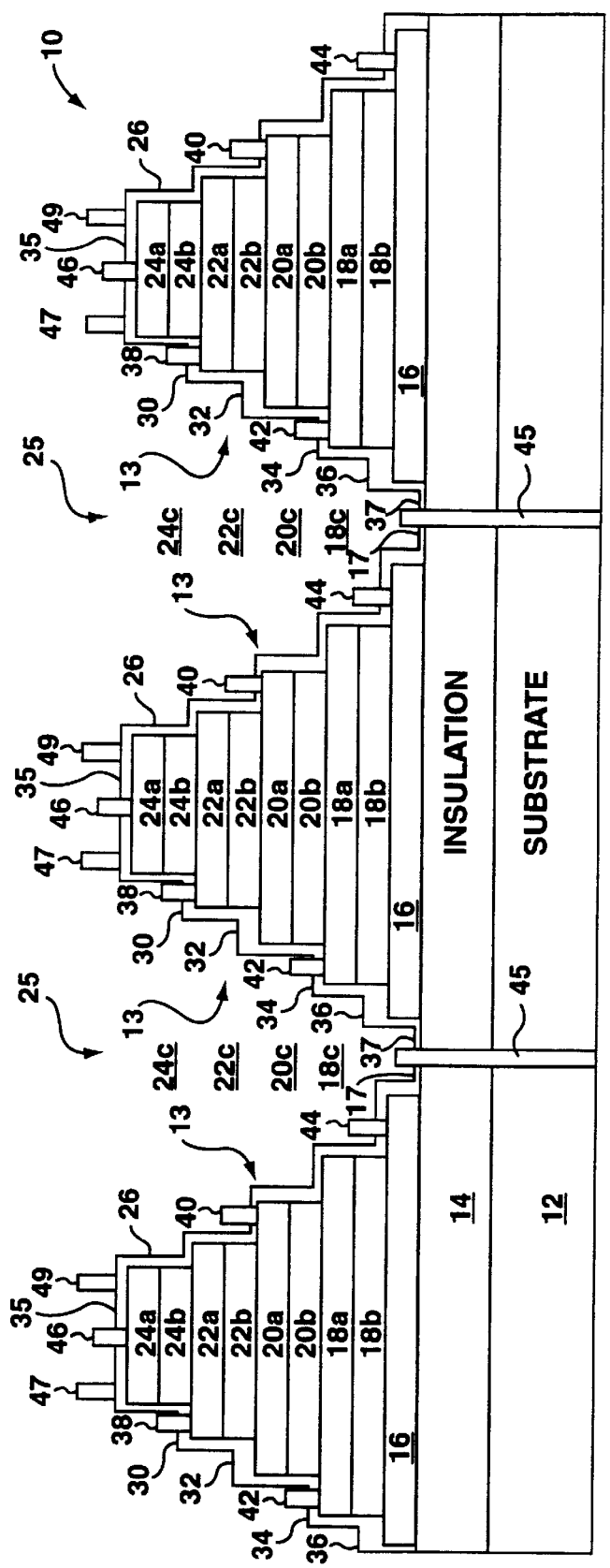
FIG. 1 is a diagrammatic side sectional view of a multi-layer distributed capacitance structure according to the invention.
Figure 2A:
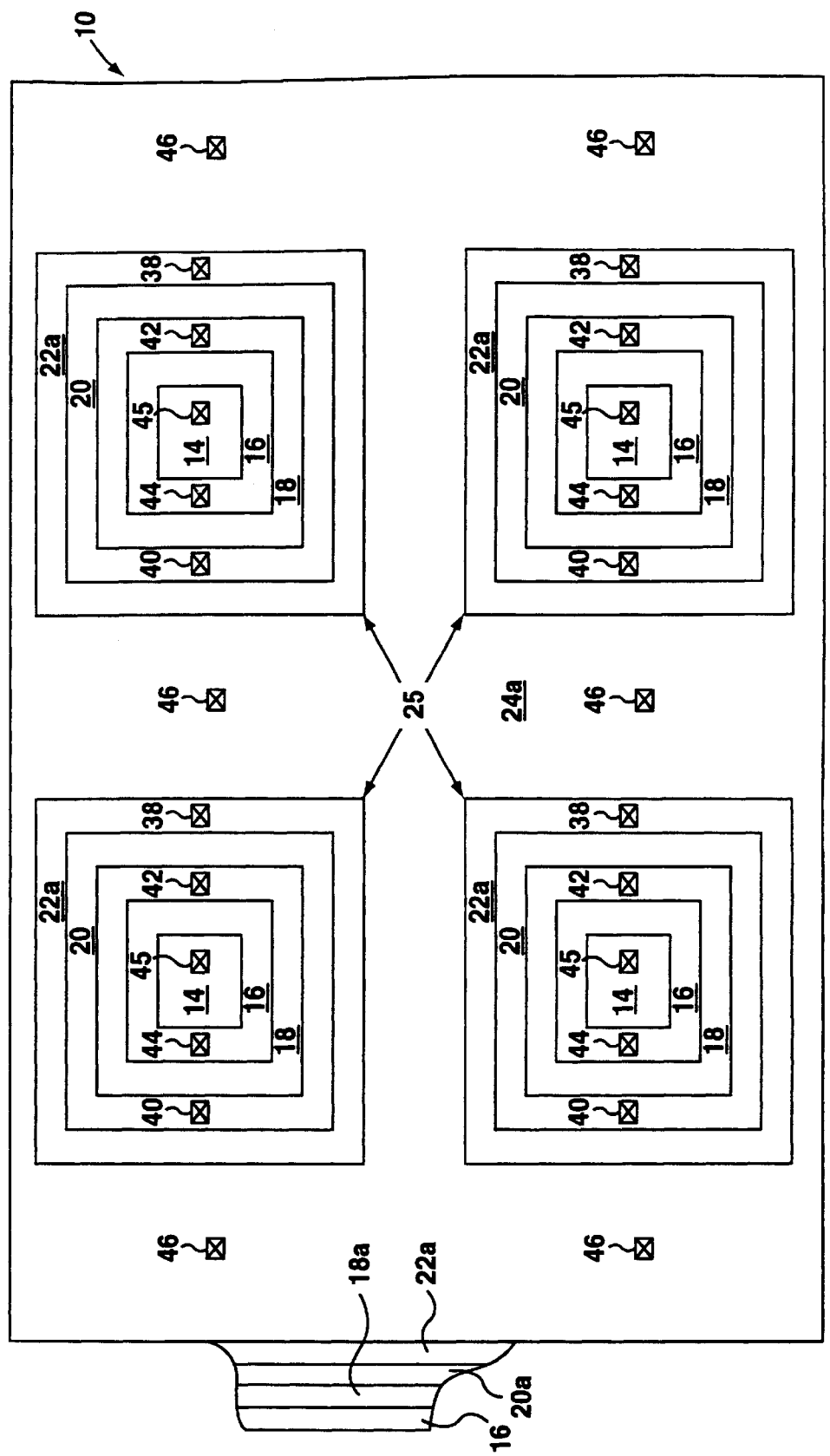
FIG. 2A is a top view of the distributed capacitance structure of FIG. 1 with the covering dielectric layer removed showing a plurality of staircase openings with a square plan configuration.

Reference is first made to FIGS. 1 and 2A, which show a preferred embodiment of a multi-layer distributed capacitance structure 10 according to the invention. Structure 10 includes a conventional substrate 12 (e.g. of silicon or any other suitable material) covered by an insulation layer 14 (e.g. of silicon dioxide or any other suitable insulator material).

A bottom electrode layer 16, formed of any suitable metal (e.g. nickel, platinum or palladium) is formed on top of insulation layer 14. Bottom electrode layer 16 contains a plurality of openings 17 through which insulation layer 14 is exposed (two openings 17 are shown in FIG. 1 and four openings 17 are shown in FIG. 2A). While it is preferred that opening 17 be of a square shape, it should be understood that they can be of any general configuration (e.g. square, circular, triangular, L-shaped). Further, it should be understood that it may be desirable to form electrode layer 16 without any openings 17, as will be described. Above bottom electrode layer 16 are successive pairs of intermediate electrode layers/dielectric layers 18a, 18b, 20a, 20b, and 22a, 22b. Above the upper intermediate layers 22a, 22b are top layers 24a, 24b (layer 24a being an electrode layer and layer 24b being a dielectric layer).

As shown in FIGS. 1 and 2A, a plurality of intermediate layer openings 18c, 20c, 22c, and top layer openings 24c are formed within bottom electrode 16 and each layer pair 18a, 18b to 22a, 22b and 24a, 24b, respectively. Layer openings 17, 18c, 20c, 22c, and 24c are formed such that layers 16 and 18a, 18b to 24a, 24b have progressively larger and larger openings in ascending order. Consequently, the surface area of each lower layer is larger than the surface area of the upper layers positioned above it. Further, each lower layers preferably extends laterally beyond and around the periphery of the openings of the layers positioned thereabove to define the layer opening for the lower layer (FIG. 2A).

As a result, a plurality of staircase openings 25 are formed in structure 10 (e.g. two staircase openings 25 are shown in FIG. 1 and four staircase openings are shown in FIG. 2A). Staircase openings 25 have sidewall surfaces 13 which are shown having an inwardly and downwardly stepped configuration. This configuration results in each electrode layer 16, 18a, 20a, 22a, and 24a having top surface areas which are not covered by an electrode or dielectric material layer above. The exposed top surface areas of each electrode layer within staircase openings 25 allow electrical contact to be made to any electrode layer 16 and 18a to 24a wherever staircase openings 25 are located along the surface of structure 10. It should be noted that openings 25 are shown closer together than they would normally be in relation to their size, for illustrative purposes only.

Figure 2B:
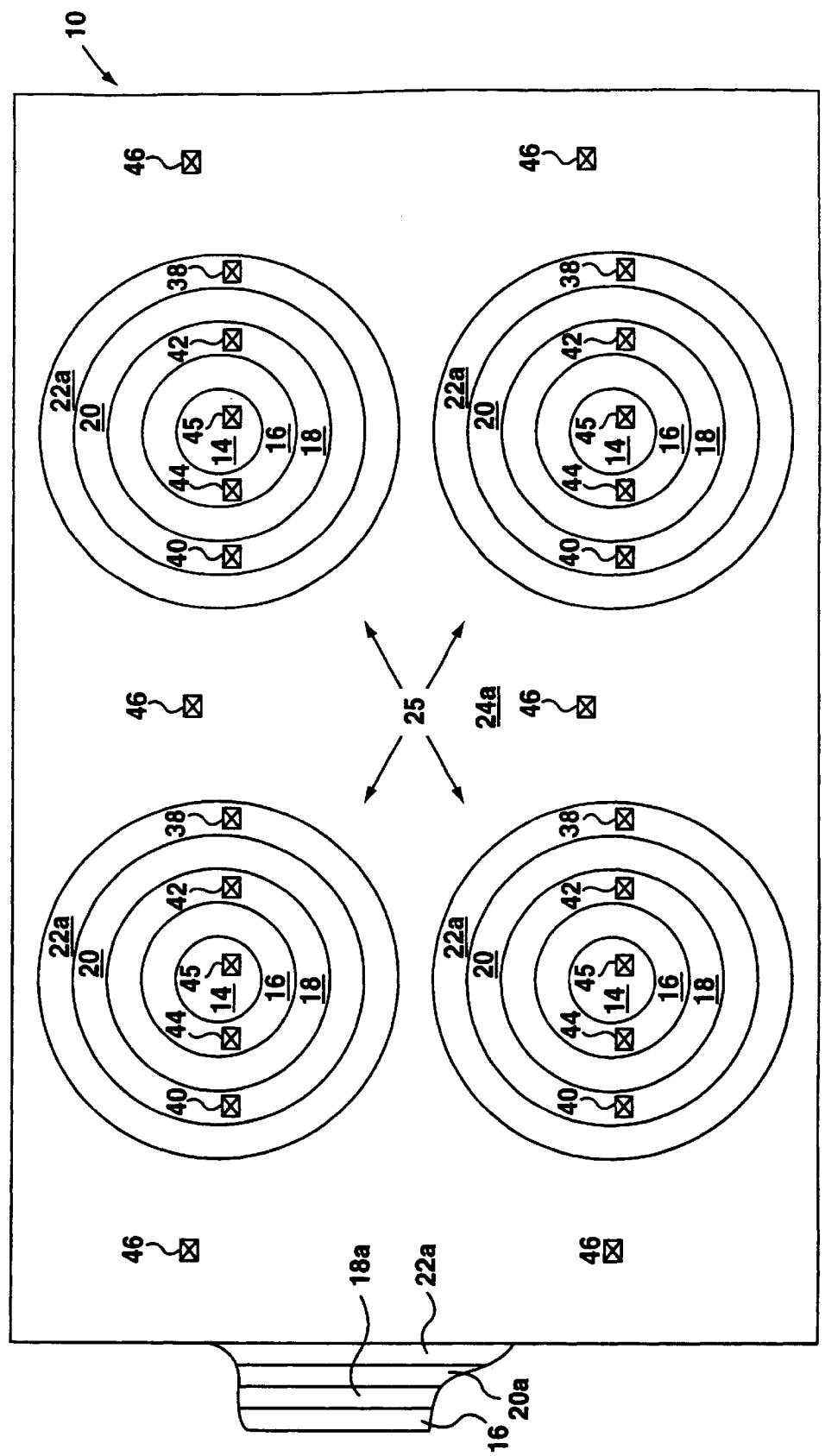
FIG. 2B is a top view of the distributed capacitance structure of FIG. 1 with the covering dielectric layer removed showing a plurality of staircase openings with a circular plan configuration.

While it is preferred that layer openings 17, 18c, 20c, 22c, and 24c of each layer pair are of a generally square shape resulting in staircase openings 25 having a generally square plan configuration as shown in FIGS. 1 and 2A, it should be understood that the individual layer openings 17, 18c, 20c, 22c, and 24c can be of any configuration (e.g. square, circular, triangular, L-shaped, etc.). For example, staircase openings 25 could alternatively have a generally circular plan configuration as shown in FIG. 2B. There are fabrication advantages associated with forming staircase openings 25 in a circular plan configuration, due to the manufacturing tolerances that are inherent in the circular shape.

Figures 1, 12A:
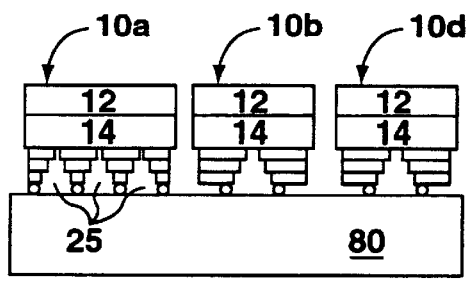
Figures 2, 12A:
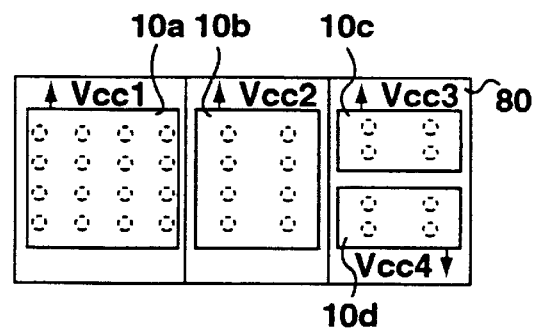

After the electrode and dielectric layers 16, 18a, 18b to 24a, 24b each having a plurality of layer openings 17 and 18c to 24c, respectively have been formed, the entire structure is covered with a layer of insulation 26, again typically silicon dioxide (shown in FIG. 1 but omitted in FIG. 2 for clarity). Since the insulation layer 26 follows the stepped pattern of the staircase openings 25, the insulation layer 26 defines a set of annular horizontal surfaces 30, 32, 34, 36 over the projecting edges of each electrode layer 22a, 20a, 18a, 16, respectively, annular surfaces 37 over the exposed regions of insulation layer 14, and horizontal surfaces 35 over the electrode layer 24a.

Windows or vias are opened on horizontal surface 35 of structure 10, on horizontal annular surfaces 44, 42, 40, 38, and 46, through which contacts 36, 34, 32, 30, and 35, are established (typically of gold or other suitable conductive material) to the electrodes layers 16, and 18a to 24a, respectively. Also, it is contemplated that a contact terminal 45 be formed within insulation layer 14 and substrate 12 to provide an electrical contact on the bottom of structure 10 for possible electrical connection to an integrated circuit positioned directly below, as will be described. Further, a power contact 47 and a ground contact 49 (also typically of gold or other suitable conductive material) are located above the insulation layer 26 (as will be described) and allow for the interconnection of structure 10 to the power supply and ground nodes of the logic gates of an integrated circuit, respectively.

Finally, as shown in FIGS. 2A and 2B, the outside edges of electrode layer 16 and layer pairs 18a, 18b to 24a, 24b, running along the outside of structure 10 also have a staircase configuration (only a portion of the outside staircase configuration is shown in each figure for illustrative purposes). This allows for electrical interconnection between the edges of these layers using contacts 44, 42, 40, 38 and 46, and power contact 47 and ground contact 49. It should be understood that while the edges of the layers 16, 18a, 18b to 24a, 24b running along the outside of structure 10, could alternatively be formed such that their edges are colinear with each other and the edges of the substrate layer 12 and insulation layer 14, it preferred to provide a staircase arrangement of these layers to facilitate electrical interconnection between the layers on the outside edge of structure 10. Such additional interconnection reduces the number of staircase openings 25 which are required to compensate for electrode spreading resistance.

All of the electrode and dielectric layers shown are film layers, deposited by conventional techniques such as sputtering, chemical vapour deposition, evaporation, or spin-on techniques, all of which are well-known in the art. The intermediate and top electrode layers are, like the bottom electrode layer 16, of any suitable metal such as platinum and/or palladium. The dielectric layers are of any desired suitable material. One class of materials which has been found to be particularly suitable is the class known as ferroelectric materials, also called polar dielectric materials, such as those disclosed in U.S. Pat. No. 5,206,788 and which are well-known in the art for capacitors. Examples of ferroelectric or polar dielectric materials are lead zirconate titanate compositions. As is well known ferroelectric (polar) dielectric materials exhibit spontaneous polarization at temperatures below their Curie temperature.

In FIG. 1 the vertical thicknesses are much exaggerated. The electrode and dielectric layers are all film layers with very small thicknesses, typically in the order of 0.03 to 1.0 $\mu$m, although they can be thicker if desired. Further, the width of the annular horizontal surfaces 30, 32, 34, and 36 is typically between one and ten $\mu$m, which is sufficient to make an electrical connection to contacts 38, 40, 42, and 44 (typically the contact will occupy between half and two-thirds of the width of the ledge on which it is located). If desired, additional electrical contacts 48, 50, 52, 54, 56 may be made to each intermediate electrode layer (see FIG. 3), so that in a given application, the shortest connection to any given electrode may be made to reduce lead inductance and for greater convenience in fabrication of the circuit package in question. It should be understood that electrical contacts may be made at any point along the annular surfaces 30, 32, 34, 36, and 37 and surface 35.

Still referring to FIG. 1, bottom electrode layer openings 17 may have a generally square-shaped cross section measuring from about five by five $\mu$m$^2$ to about ten by ten $\mu$m$^2$ to allow ample room for electrical connection to contact 45. Accordingly, layer openings 18c will have a corresponding cross-sectional dimension comprising the dimension of opening 17 in addition to the additional cross-sectional area required for the desired width of annular horizontal surface 36. Similarly, openings 20c, 22c, and 24c will be of incrementally increasing dimensions according to the respective desired widths of the annular horizontal surfaces 34, 32, 30 and 35.

Finally, it is contemplated that the relative spacing of staircase openings 25 on structure 10 is primarily dependent on the relative positioning of the logic gates of an integrated circuit, to which structure 10 is to be attached. However, it should be understood that for most applications, it is preferred to locate staircase openings 25 within structure 10 such that they are positioned at a distance from each other that is more than three times the dimension of layer opening 24c. If staircase openings 25 are positioned closer to each other than this, then a substantial loss of capacitance will result from the amount of electrode and dielectric layer surface area that would need to be removed in order to form staircase openings 25. However, the number and location of staircase openings 25 to be provided in structure 10 may vary depending upon the capacitance desired and accordingly, upon the desired combined area of layers 16, 18a, 18b to 24a, 24b.

Figure 4A:
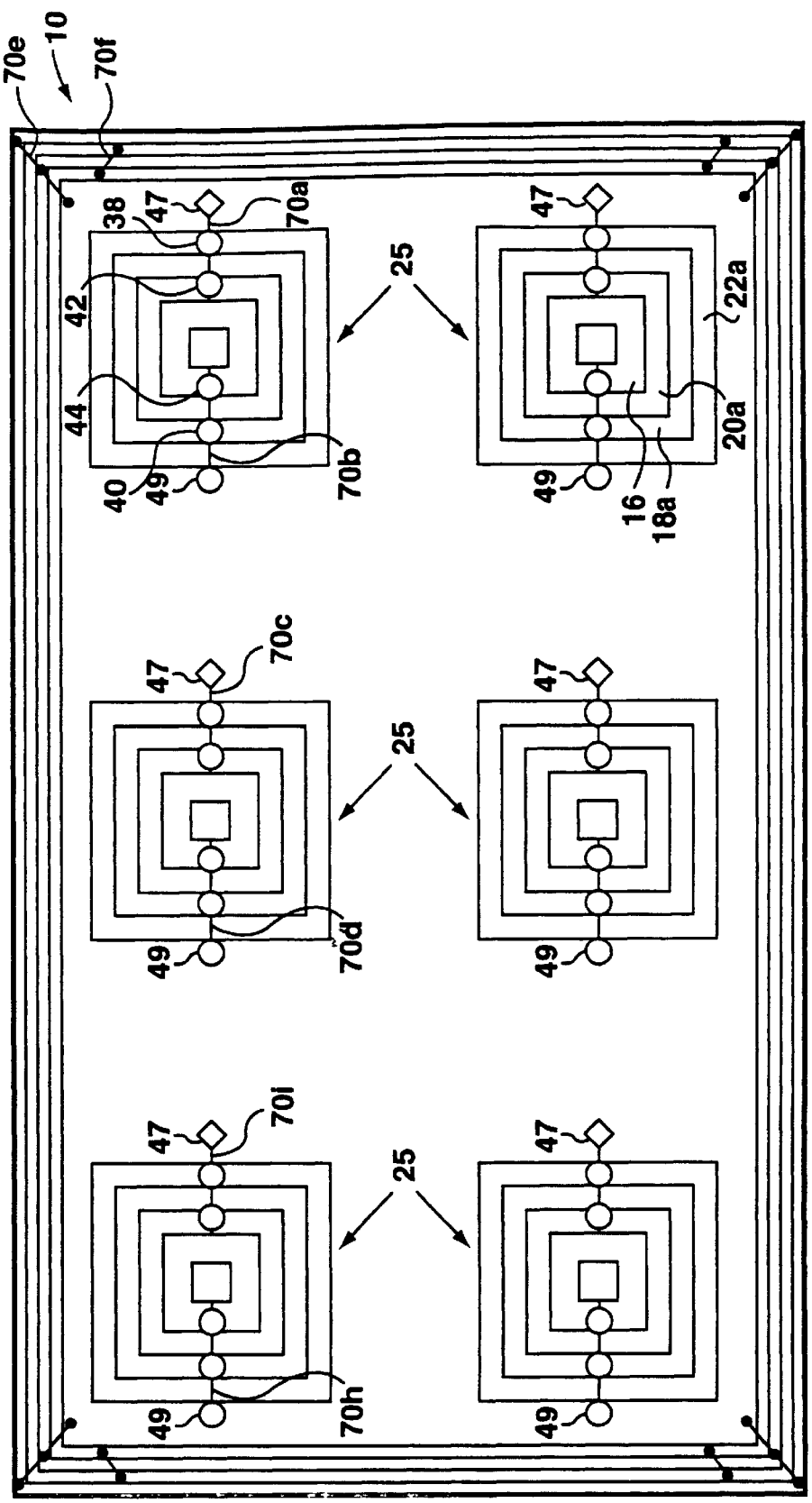
FIG. 4A is a top view of the distributed capacitance structure of FIG. 1 illustrating a possible configuration of wiring interconnections between the electrode layers.
Figure 4B:
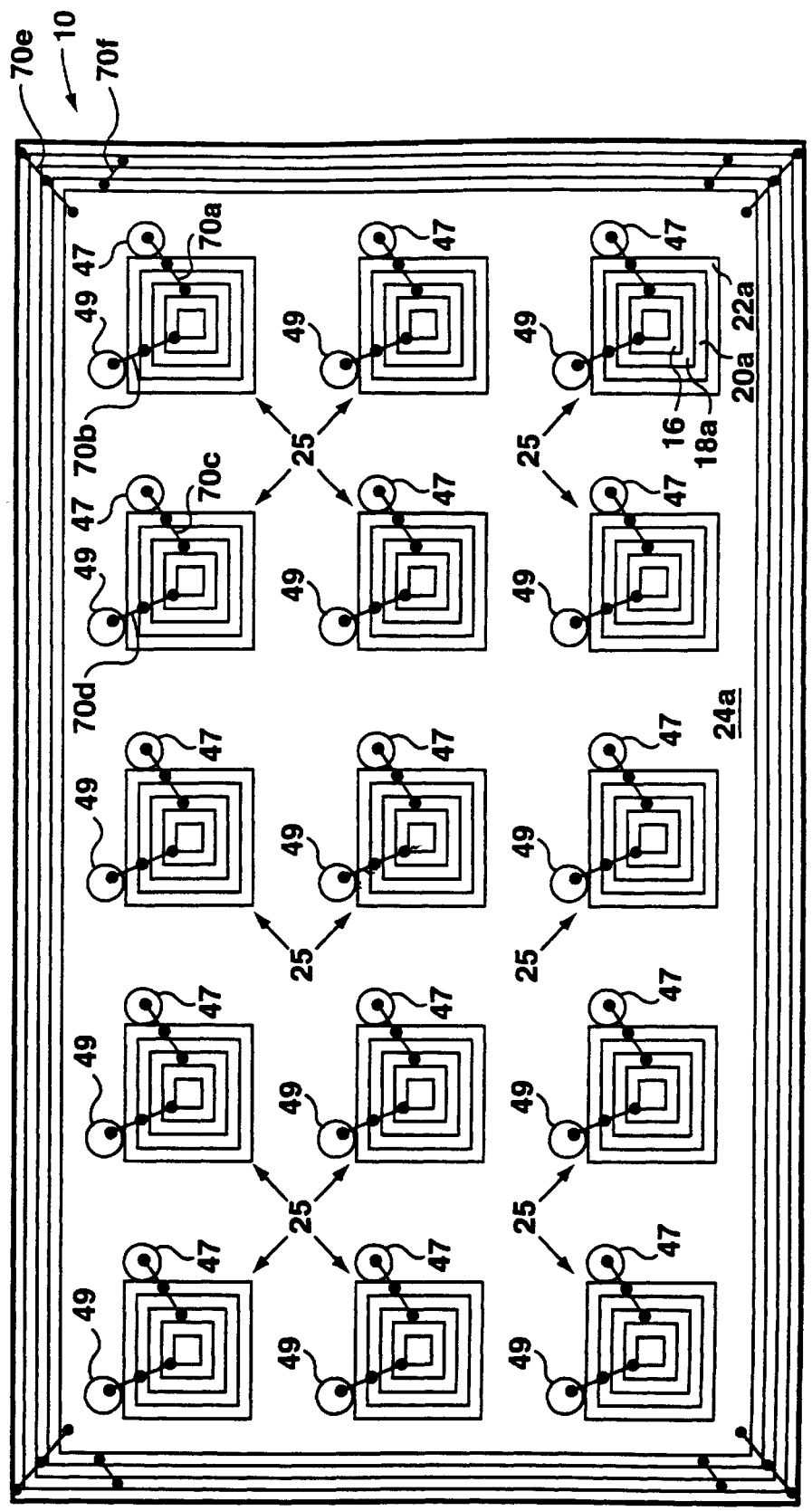
FIG. 4B is a top view of the distributed capacitance structure of FIG. 1 Illustrating another possible configuration of wiring interconnections between the electrode layers.
Figure 4C:
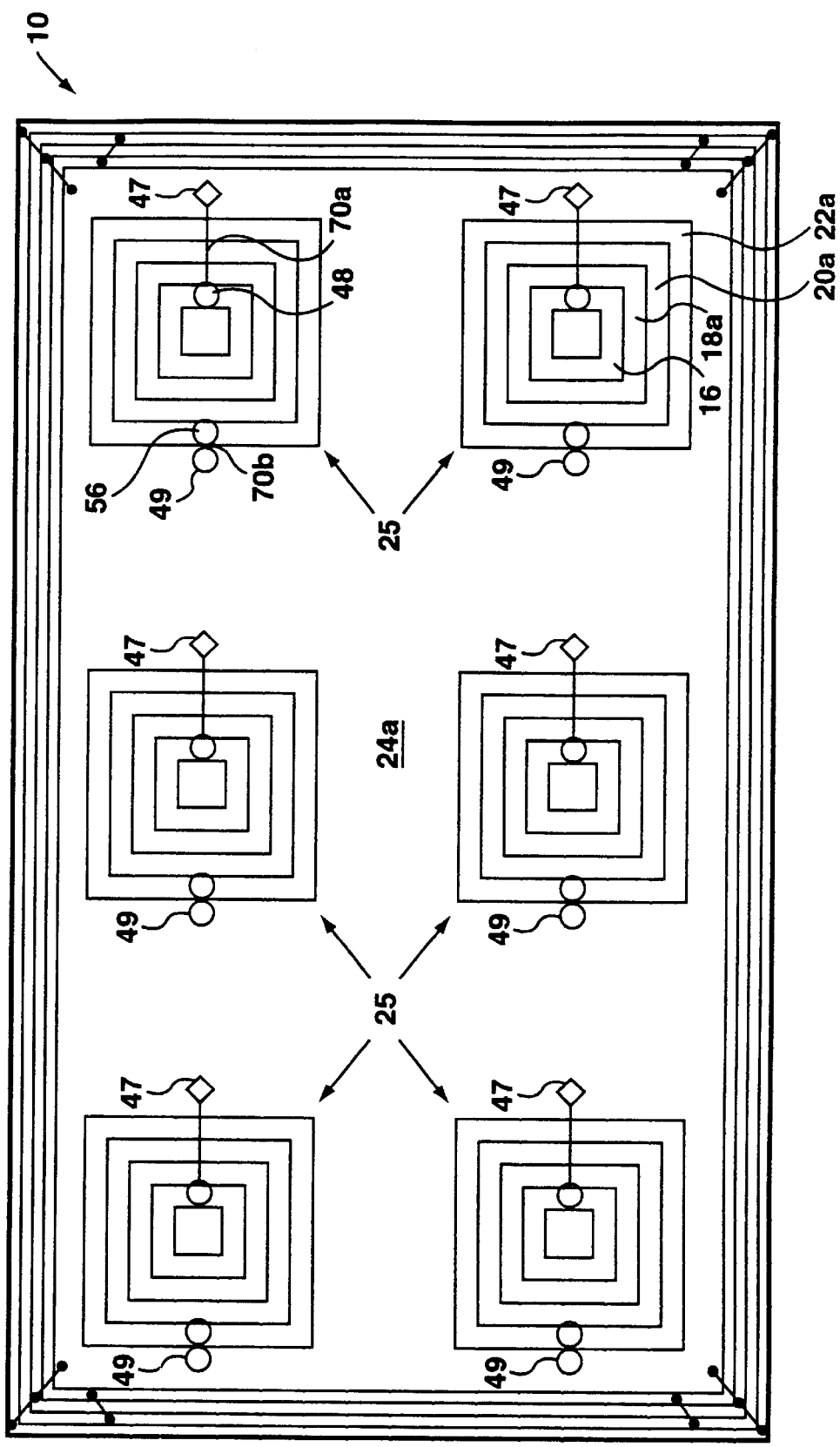
FIG. 4C is a top view of the distributed capacitance structure of FIG. 1 illustrating another possible configuration of wiring interconnections between the electrode layers.

FIGS. 4A to 4C illustrate, by way of example, a number of ways electrical connections to electrode layers 16 and 18a to 24a of the structure 10 can be made. Electrode layers are electrically connected to power and ground contacts 47, 49 using power and ground wire interconnects 70a and 70b, respectively. It should be understood that since various combinations 15 of electrode layers 16 and 18a to 24a can be electrically connected to either power or ground contacts 47, 49, structure 10 may be flexibly customized to provide different values of capacitance. While any combination of connections between electrodes and power and ground contacts 47, 49 can be made, it is necessary to ensure that the specific interlayer wiring connection configuration utilized within a particular staircase opening 25, is reproduced amongst the layers within all other staircase openings 25 and between the layers running along the edges of structure 10, in order to avoid electrical shorting within the device.

For example, FIG. 4A shows how electrode layers are electrically connected to power contact 47 and ground contact 49 using power and ground wire interconnects 70a and 70b. Specifically, power contact 47 is electrically connected to electrode layers 18a and 22a through power wiring interconnect 70a and contacts 42 and 38, and ground contact 49 is electrically connected to electrode layers 16 and 20 a through ground wiring interconnect 70b and contacts 44 and 40. This particular interlayer wiring configuration is reproduced using interconnects 70c, 70d, 70h, 70i etc. within each staircase opening 25 and also by using interconnects 70e, 70f on the outside edges of layers 16, 18a, 18b to 24a, 24b. As discussed before, interconnects 70e, 70f must be provided on the outside edges of structure 10 having the identical wiring configuration of interconnects 70a, 70 b, 70c, 70d, 70h, 70i, etc. in order to prevent shorting of structure 10. The use of interconnects 70e, 70f along the outside edges of layers 16, 18a, 18b to 24a, 24b allow for the additional reduction of electrode spreading resistance within structure 10.

FIGS. 4B and 4 C illustrate alternative interlayer connection arrangements. Specifically, FIG. 4B shows the same interlayer wiring configuration as shown in FIG. 4A, wherein power and ground wiring interconnects 70a and 70b connect contacts on the appropriate electrode layers 16 and 18a to 24a which are positioned at different points along the extent of the annular horizontal surfaces 30, 32, 34, and 36. Structure 10 of FIG. 4B contains a larger number of staircase openings 25 then was the case with structure 10 of FIG. 4A.

Finally, FIG. 4C shows a different interlayer wiring configuration where power contact 47 is electrically connected to electrode layer 16 at contact 48 through power wiring interconnect 70a, and ground contact 49 is electrically connected to electrode layer 24a through contact 56 ground wiring interconnect 70b. It should be noted that, in this structure, none of the outside edges of electrode layers 16 and 18a to 24a are interconnected.

In addition, if desired, each electrode/dielectric layer pair 18a, 18b to 24a, 24b may have inset areas to facilitate electrical contact to the 25 electrode layer below it. This is shown in FIG. 5, which shows one electrode/dielectric layer pair 20a, 20b and an electrode layer below 18a. Electrode/dielectric layer pair 20a, 20b has inset corners 55 which expose widened ledge areas 56 on the electrode layer 18a, for the establishment of contacts 57. Such widened ledge areas can also be exposed at other locations along the periphery of each electrode layer.

Accordingly, structure 10 as shown in FIGS. 1 to 2B and 4A to 4C, provides independent and optional access to any desired combination of capacitor electrode layers, at more than one position for each layer, resulting in customization flexibility, optimization of parametric and reliability performance of each capacitor structure, and production efficiency. While three pairs of intermediate electrode/dielectric layers have been shown, it will be realized that any desired number of intermediate layers can be provided. In addition, as previously mentioned, staircase openings 25 can be of any shape (e.g. square, rectangular, round, elliptical, triangular, L-shaped, etc.). A further advantage of forming staircase openings 25 such that contacts can be located on the exposed edges, is that it is not necessary to have openings through dielectric layers, which although contemplated by the invention, could cause defects and adhesion problems.

It will be realized that when layers of film, particularly thin film layers, are stacked, it can be difficult to maintain the integrity and accuracy of the film edges. However with staircase openings 25, a greater tolerance can be permitted than with a stacked structure having vertically coincident edges. Thus, as shown in FIG. 6, for each staircase opening 25, the outer lateral edges of the dielectric layers can occur at any location between the indicated manufacturing lines 58 and the outer lateral edges 59 of the electrode layers on top of the dielectric layer in question, thereby providing a substantial degree of manufacturing tolerance, with less risk of overhanging edges.

In addition, when stepped (i.e. staircase pattern) edges are provided, as shown in FIGS. 1 to 4C, there is less likelihood that excessively high vertical edges will be formed which are difficult for the thin film insulation layer 26 (or a thin film interlayer dielectric) to cover.

Figure 7A:
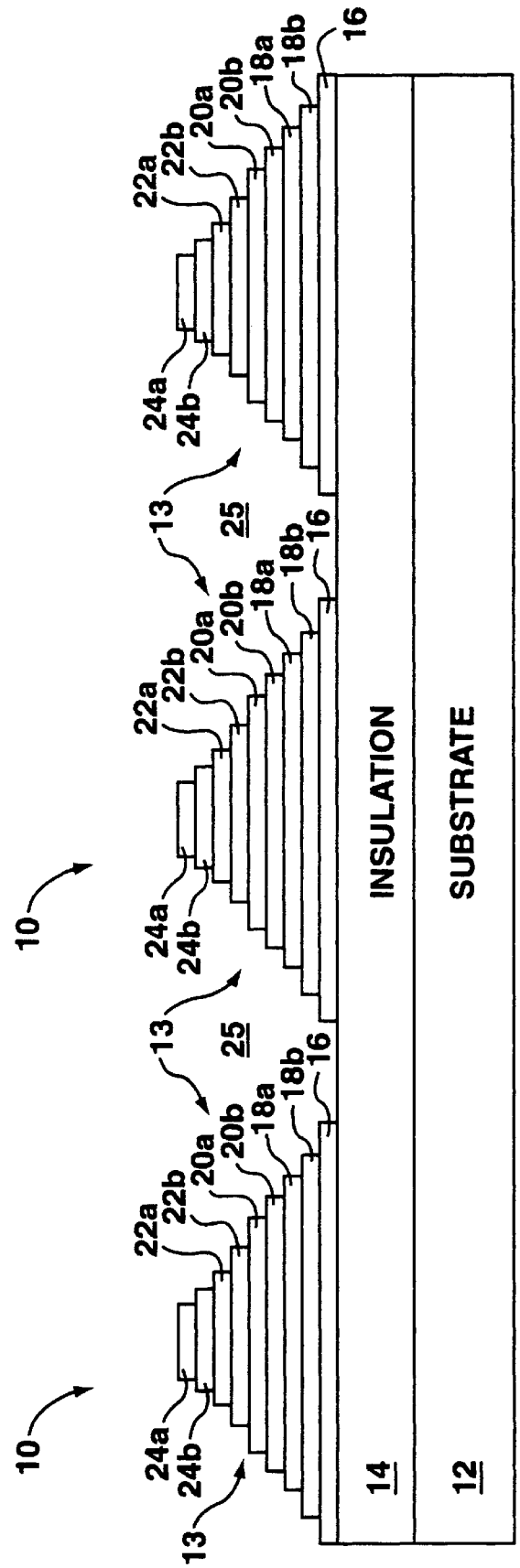
FIG. 7A is a diagrammatic side sectional view of the distributed capacitance structure showing how the individual electrode and dielectric layers of each electrode/dielectric layer pair can be staggered within each staircase opening and around the peripheral edges of the distributed capacitance structure.

FIG. 7A shows an alternative embodiment of structure 10, wherein the individual electrode and dielectric layers 16, and 18a, 18b to 24a, 24b are all individually staggered such that each electrode and dielectric layers 16, 18a, 18b to 24a, 24b cover progressively smaller and smaller areas in ascending order. Sidewall surfaces 13 of staircase openings 25 are each shown having a regular stepped configuration. It should be understood that in such a configuration, it is possible to provide electrical access to each lower electrode layer 16, 18a to 20a through the respective dielectric layers 18b to 24b positioned immediately above.

Figure 7B:
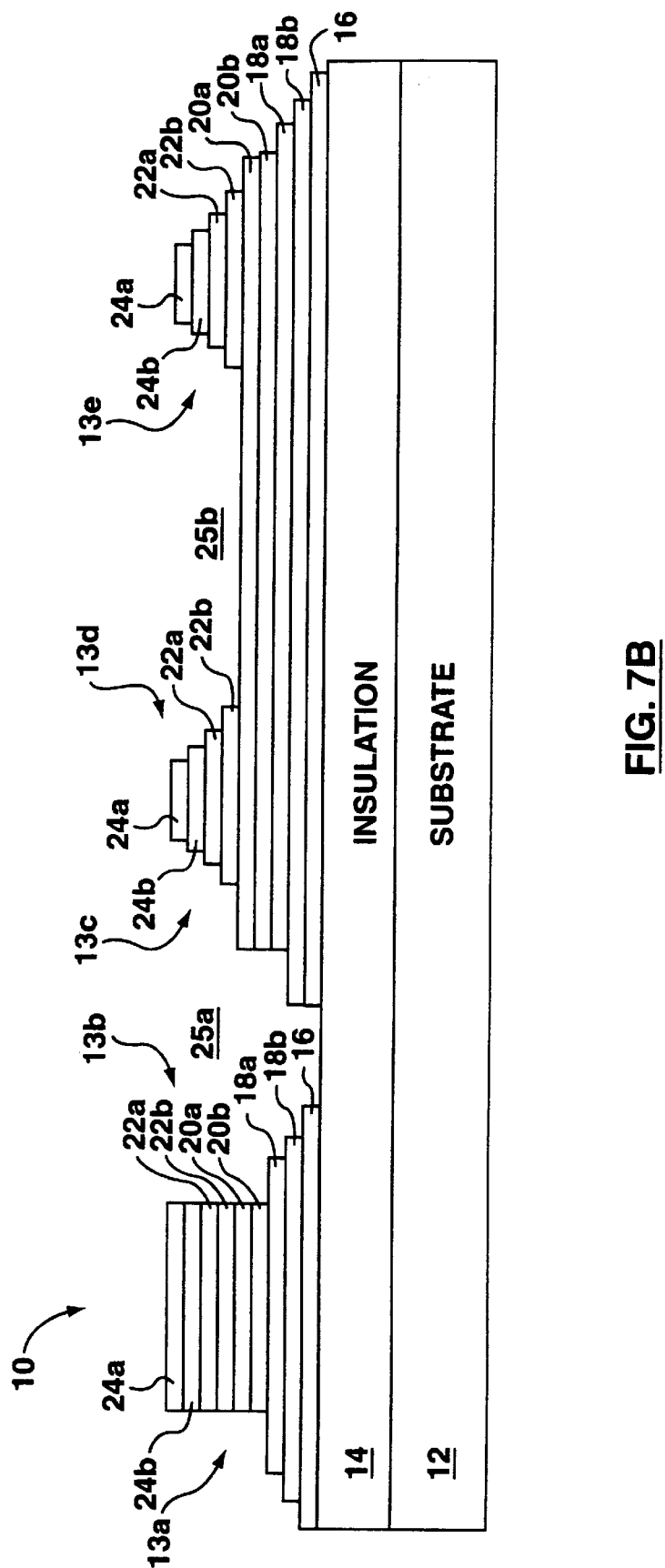
FIG. 7B is a diagrammatic side sectional view of the distributed capacitance structure showing how different staircase openings configurations can be formed within the distributed capacitance structure.

Referring to FIG. 7B, while it is preferred that staircase openings 25 penetrate all of electrode and dielectric layers 16, 18a, 18b to 24a, 24b (FIG. 1), it should be understood that staircase openings 25 may also be formed to penetrate electrode and dielectric layers 16, 18a, 18b to 24a, 24b to differing extents. For example, while staircase opening 25 a penetrates all electrode and dielectric layers 16, 18a, 18b to 24a, 24b, staircase opening 25b only penetrates electrode and dielectric layers 22a, 22b to 24a, 24b. Also, it should be understood that staircase openings 25 do not have to be formed having sidewall surface 13 with a regular stepped configuration (FIGS. 1 or FIG. 7A). Rather, electrode and dielectric layers 16, 18a, 18b to 24a, 24b can be formed having a number of coincident edges, such as sidewall surfaces 13b, 13c, 13d, and 13e within openings 25 a and 25b, respectively, each of which contain uniformly flat sections as shown.

Figure 8:
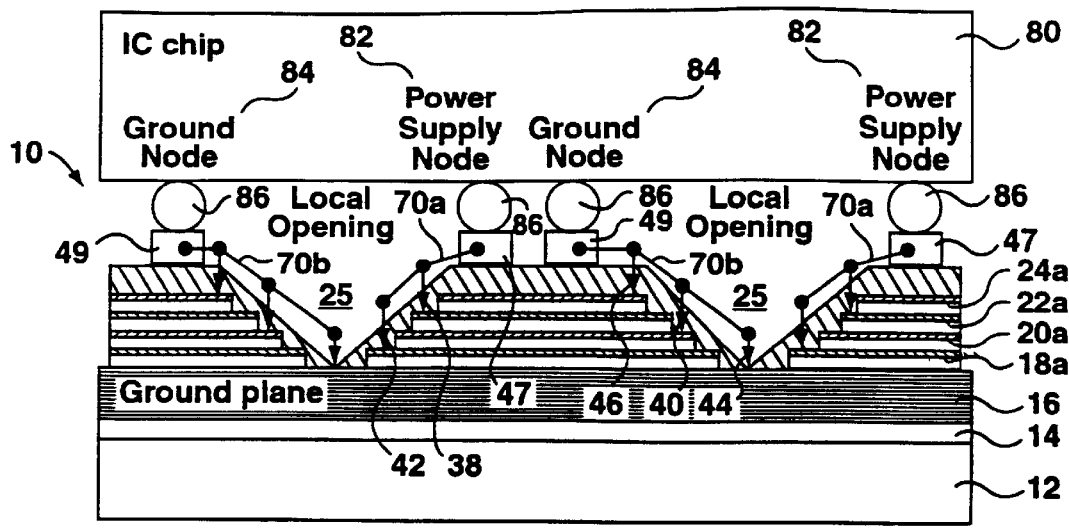
FIG. 8 is a diagrammatic side sectional view of the distributed capacitance structure of FIG. 1 electrically coupled to the power supply and ground nodes of two logic gates residing on an integrated circuit.

As shown in FIG. 8, alternating electrode layers 16 and 18a to 24a of structure 10 can be electrically connected to power supply and ground nodes 82, 84 of individual logic gates residing on an integrated circuit 80. It should be noted that alternating electrode and dielectric layer pairs 18a, 18b to 24a, 24b are shown having coincident edges, although they may also be staggered as shown in FIG. 7A. Integrated circuit 80 is directly mounted on structure 10 using conventionally known "flip-chip" compact bump technology wherein a number of flip-chip compact bumps 86 are formed between power supply and ground nodes 82, 84 and corresponding power and ground contacts 47, 49, respectively, as shown.

Power and ground contacts 47 and 49 are electrically connected to selected electrode layers using power and ground wire interconnects 70a and 70b within each staircase opening 25, as shown. Specifically, power wire interconnects 70a electrically connect power contact 47 to contacts 42, 38 on electrode layers 18a and 22a, respectively. Ground wire interconnects 70b connect ground contact 49 to contacts 44, 40, 46 on electrode layers 16, 20a and 24a, respectively. Accordingly, power and ground nodes 82 and 84 of integrated circuit 80 are electrically connected to the electrode layers 16, 18a, 20a, 22a, and 24a of structure 10 within each staircase opening 25.

It should be understood that while the wiring representation used in FIGS. 8 and 16 to 21 suggests the existence of an "air gap" between the power and ground wire interconnects 70a and 70b and the insulation layer 26, this notation has been adopted to signify conventional connection wiring which is formed directly on top of insulation layer 26. Further, it should be noted that in this embodiment, electrode layer 16 does not contain any layer openings 17, but rather is formed as a continuous ground plane which is electrically connected through ground wiring interconnects 70b to ground node contact 49.

Figure 9:
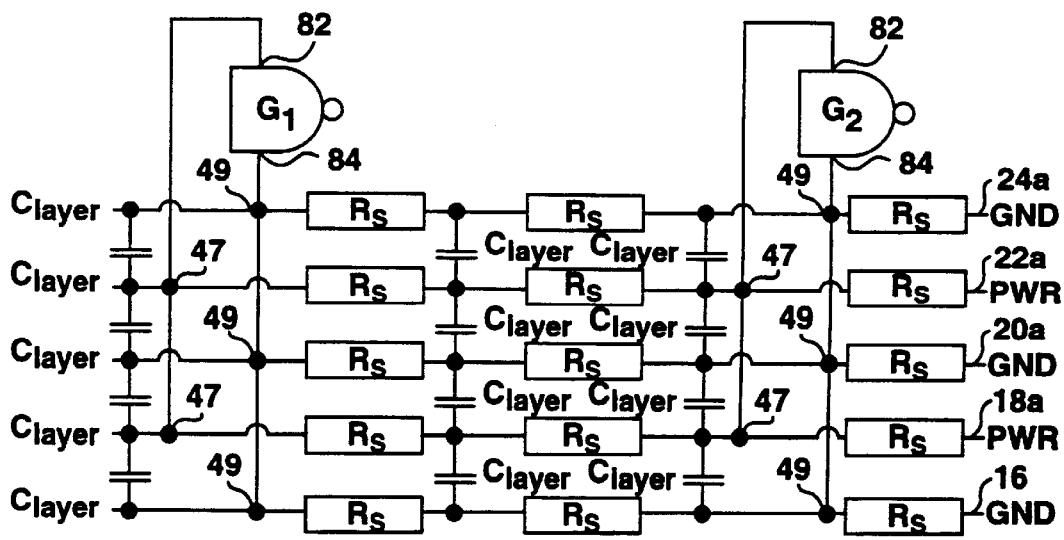
FIG. 9 is a schematic representation of the circuit equivalent of the distributed capacitance structure of FIG. 8.
Figure 10:
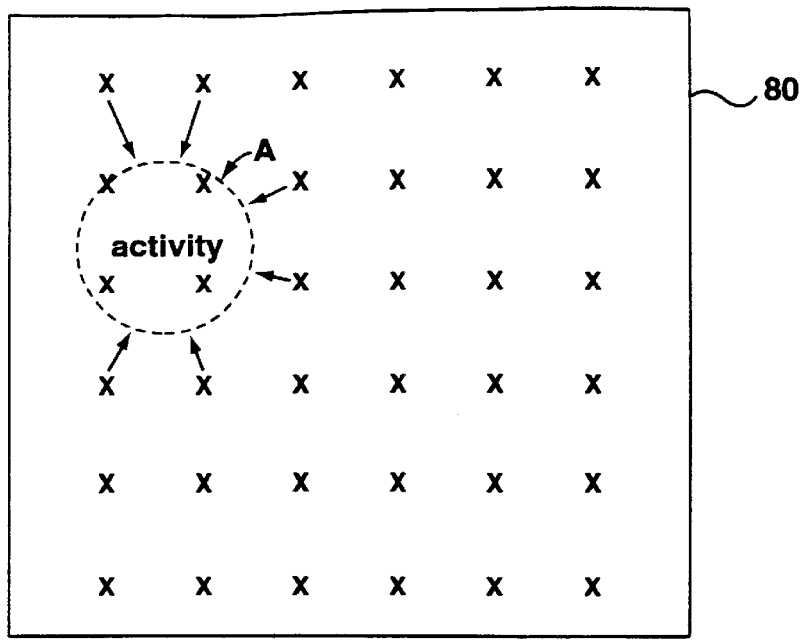
FIG. 10 is a diagrammatic view of the bottom of an integrated circuit illustrating how regions of high activity can be provided with the appropriate transient currents using the array of staircase openings of the distributed capacitive structure of FIG. 1.

FIG. 9 shows a representative equivalent circuit for the interconnected structure 10 and integrated circuit 80 of FIG. 10. As shown, the power and ground contacts 47, 49 of logic gates $G_1$ and $G_2$ of integrated circuit 80, are each electrically connected to one or more of electrode layers 16 and 18a to 24a. Specifically, the power supply nodes 82 of logic gates $G_1$ and $G_2$ are connected to electrode layers 18a and 22a and the ground nodes 84 of logic gates $G_1$ and $G_2$ are connected to electrode layers 16, 20a, and 24a.

As indicated in FIG. 9, a plurality of distributed layer capacitances $C_{layer}$ are formed within structure 10. Each layer capacitor $C_{layer}$ represents the local capacitance effect of two electrode layers positioned on each side of a dielectric layer. Structure 10 also includes a plurality of resistances $R_S$, each of which is located in series with a corresponding layer capacitance $C_{layer}$. Resistance $R_S$ represents the finite parasitic spreading resistance of the local section of the electrode that extends between logic gates $G_1$ and $G_2$. It should be noted that while the resistances $R_S$ of structure 10 contribute a finite equivalent series resistance to the overall circuit, the total value of this equivalent series resistance as seen between the respective power and ground nodes of any two adjacent logic gates $G_1$ and $G_2$ is substantially less than the total series resistance that would be associated with a capacitor of equivalent overall value having electrodes only connected at the edges of the capacitor. Finally, since parasitic inductance of structure 10 can generally be considered negligible as will be explained, it is not represented in FIG. 9.

Accordingly, an overall distributed decoupling capacitance $C_D$ (not shown) is provided across the power supply and ground nodes 82, 84 of logic gates $G_1$ and $G_2$ which effectively shunts the high frequency components of a noise signal associated with logic gates $G_1$ and $G_2$. The current flowing through structure 10 must pass through a spreading resistance element $R_S$ before it can reach an adjoining shunting layer capacitance $C_{layer}$. Accordingly, the value of decoupling capacitance $C_D$ is dependant on the extent to which spreading resistance limits the current flow within structure 10. The amount of current which can pass through structure 10 will also depend on the local RC constant as well as on the capacitive density of layer capacitance $C_{layer}$ (i.e. dependent upon the dielectric constant of the dielectric layers 18b to 24b), as is conventionally known.

Decoupling capacitors contain a number of imperfections including parasitic series inductance, which is also termed lead inductance, package inductance or mounting inductance. Lead inductance acts like a inductance in series with the capacitor. Decoupling capacitors also include a parasitic series resistance, called equivalent series resistance (ESR). ESR is a real-valued impedance, is not a strong function of frequency, and acts like an ordinary resistor in series with the capacitor. Both ESR and the lead inductance degrade a capacitor's effectiveness as a decoupling element. The full equation for capacitor impedance as a function of frequency is:

$$X(f) = \left[ ESR^2 + \left( \frac{1}{2\pi fC} + 2\pi fL \right)^2 \right]^{1/2}$$

where
ESR=equivalent series resistance (ohms)
C=capacitance (farads)
L=lead inductance (henries)
X(f)=impedance magnitude (ohms) at frequency f (hertz).

Accordingly, to reduce switching noise it is desirable to increase the capacitance, while reducing the lead inductance and ESR of a decoupling capacitive structure. It should be noted that the lead inductance L is dependent on the overall inductance present within the electrical path associated with the decoupling capacitor. Further, all of these measures are especially critical to the proper operation of a device during high frequency operation.

Since the power and ground electrodes of structure 10 are positioned substantially close to the power supply and ground nodes 82, 84 of integrated circuit 80 and are electrically connected using short power and ground wire interconnects 70a and 70b and flip-chip compact bump technology, a local decoupling capacitance $C_D$ is provided having minimal lead lengths. Reduced lead lengths results in lowered circuit inductance and resistance of structure 10. The use of a local decoupling capacitor $C_D$ (i.e. with short leads) results in especially low impedance at higher frequencies since a substantially short bypass path is provided to currents which would otherwise be affected by the inductance of the power supply wiring.

Further, since electrode and dielectric layers 16, 18a, 18b to 24a, 24b are all preferably made of thin film, the power and ground electrodes of structure 10 are arranged substantially close to each other, and represent a substantially large capacitive value. Even though electrode layers 16 and 18a to 24a contain openings 17 and 18c to 24c, the total area of these openings should be small relative to the overall surface area of structure 10. For typical application, the aggregate total surface area of openings 24c should be less than 10 percent of the overall surface area of structure 10, although lesser or greater limits could be applicable depending on the particular application of structure 10. Accordingly, the overall high capacitive character associated with the large area power and ground electrodes of structure 10 will not be substantially affected. The high capacitance produced by the large area power and ground electrodes, further decreases the overall effective impedance and likewise, the associated switching noise.

Staircase openings 25 of structure 10 provide a plurality of access points from the multi-layer capacitance structure to the power supply and ground nodes 82 and 84 of integrated circuit 80, which effectively forms a large number of relatively small capacitances within structure 10. It should be noted that when a decoupling capacitor array of a given nominal total capacitance is operated at low frequencies, the capacitive reactance and the resistance of the power distribution wiring will dominate the impedance between power and ground. However, at high frequencies, the inductance of the power distribution wiring dominates such that it is more important to ensure that particularly low-impedance decoupling capacitors are used to provide low-impedance paths between power and ground nodes. As is conventionally known in discrete capacitor technology, low inductance values result from the arrangement of a large number of small decoupling capacitors in parallel. An analogous advantage is realized in structure 10 especially if it contains a reasonably large number of staircase openings 25 spatially adjacent to power and ground nodes at circuit sites that are especially prone to switching noise.

Accordingly, due to the close proximity of each local capacitor to power supply and ground nodes 82, 84 of integrated circuit 80, the use of localized flip-chip compact bumps 86 between structure 10 and integrated circuit 80, the use of thin film dielectric layers between large area electrodes, and the provision of an array of small capacitances along the surface of structure 10, it is contemplated that the present invention may achieve lead inductance values in the 1 to 100 pH range. It is contemplated that with such small inductance values, structure 10 could be used to support a high-speed digital integrated circuit 80 running at gigahertz clock rates.

For illustrative purposes, the following table illustrates conventionally known lead inductance values of commercially available packages (source: H. B. Bakoglu, *Circuits, Interconnections, and Packaging for VLSI,* Addison-Wesley, Reading, Mass., 1990, Table 6.2).

| Product | Inductance (nH) |
| --- | --- |
| 14-pin plastic dual in-line package (DIP) | 8 nH |
| 68-pin plastic DIP | 35 nH |
| 68-pin surface-mount plastic leaded chip carrier (PLCC) | 7 nH |
| Wire bonded to hybrid substrate | 1 nH |
| Solder bump to hybrid substrate | .01 nH |

FIG. 10 illustrates the application of structure 10 to an integrated circuit 80 having transient localized high-power activities (only one location shown). The underside of integrated circuit 80 is shown having a plurality of connections to the electrode layers of structure 10 at staircase openings 25 (at points marked "x"). At a particular instant of time, integrated circuit 80 has a particular area of high circuit activity identified as region A (i.e. this region will have high power requirements). It should be noted that over time region A will be located at different areas along the surface of integrated circuit 80.

Since structure 10 is connected to the power supply and ground nodes 82, 84 of the logic gates of integrated circuit 80 at the points marked "x", a number of locally connected decoupling capacitances $C_D$ are provided. As shown, logic gates within region A experiencing high activity can benefit from the capacitance of local decoupling capacitors $C_D$ within a range limited by electrode spreading resistance, since these decoupling capacitors $C_D$ will not be fully loaded by other concurrent logic gate activity occurring at that time.

Figure 11:
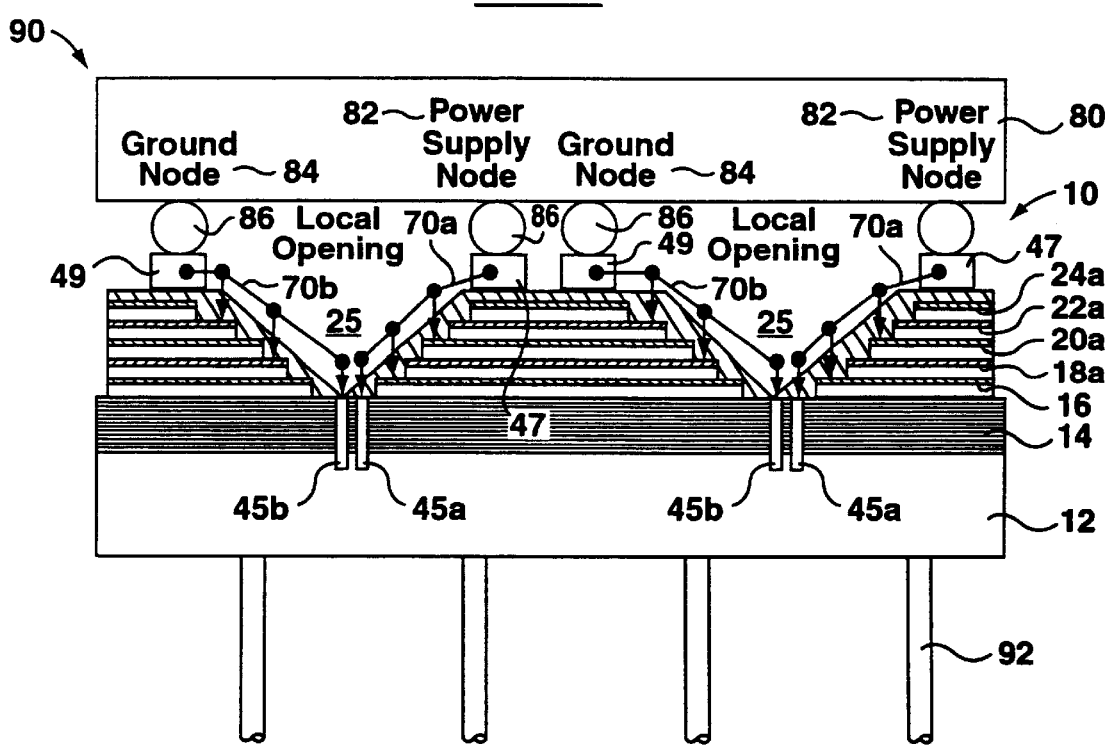
FIG. 11 is a side diagrammatic view of the distributed capacitive structure of FIG. 1 installed within an integrated circuit package.

As shown in FIG. 11, an integrated circuit package 90 can be fashioned which includes integrated circuit 80, flip-chip mounted to structure 10, wherein structure 10 serves as a power distribution circuit for integrated circuit 80. Terminals 45a and 45b are located within substrate 12 and insulation 14 and are electrically connected to certain electrode layers 16 and 18a to 24a, as shown. Specifically, terminals 45a are electrically connected to electrode layers 16 and 20a through power wire interconnect 70a and terminals 45b are electrically connected to electrode layers 18a and 22a through ground wire interconnect 70b.

Power supply voltage and ground are provided directly to structure 10 through electrical connections (not shown) between terminals 45a and 45b and a plurality of pins 92 that extend from the bottom surface of substrate 12. It should be understood that terminals 45a and 45b can be electrically connected to pins 92 using conventional integrated connection techniques. Pins 92 are typically mated with a corresponding socket (not shown) that is mounted to an external printed circuit board (not shown). Accordingly, since pins 92 are connected to the power and ground buses of the external printed circuit board, pins 92 provide power supply and ground connections to structure 10 through terminals 45a and 45b. Structure 10 then provides power supply and ground connections to power and ground nodes of integrated circuit 80 through power and ground contacts 47 and 49 which are connected to power and ground wire interconnects 70a and 70b, respectively.

As previously discussed, due to the specific geometry of the electrode and dielectric layers of structure 10, each local decoupling capacitance $C_D$ has a relatively low impedance value in comparison to conventional decoupling capacitance structures. When structure 10 is incorporated into package 90 and utilized as a power distribution circuit for integrated circuit 80, the impedance of the entire electrical path can be significantly reduced. By eliminating the inductance and resistance which is normally inherent in typical power distribution wiring, further reductions of switching noise can be achieved using structure 10 in this way.

Since electrode layers 16 and 20a are electrically connected to the ground node 84 of integrated circuit 80, they each act as low impedance ground planes. Since electrode layers 18a and 22a are electrically connected to the power supply node 82 of integrated circuit 80, they both act as low impedance power planes. Further, since the electrode and dielectric layers of structure 10 are all substantially planar, the benefit of using a collection of parallel positioned power and ground conductors is obtained, as will be described.

Substantial power distribution wiring resistance exists between the power supply and switching logic on an integrated circuit. This resistance can induce voltage drops across the wiring which are proportional to the operating current. This in turn can cause the supply voltage at individual logic gates to fall outside their specified operating range. Accordingly, it is desirable to maximize the capacitance C and to minimize the inductance and resistance of the electrical path in order to reduce switching noise and to provide desirable high-frequency operation of an integrated circuit.

Referring back to FIG. 11, it should be noted that each conductor plane of structure 10 will provide minimal electrical path inductance and resistance. As is conventionally known, wide, flat parallel distribution wiring structures provide lower inductance than round wires. The lowest-inductance distribution wiring uses multiple parallel flat ribbons, with power and ground on alternating layers. Specifically, the inductance of a stack of parallel flat ribbons is known to be:

$$L_{\mathit{eff}} = 3.19 \frac{XH}{W(N-1)}$$

where:
X is the length of the ribbon, (meters)
H is the separation between ribbon plates, (meters)
W is the width of the ribbon, (meters)
N is the number of plates, and
$L_{\mathit{eff}}$ is the inductance, (henries).

For a given cable length, the inductance is inversely proportional to the width (W) of the ribbon, as well as to the number of layers, but proportional to the separation distance (H) between them. For the same ribbon plate area of XW, a short ribbon (i.e. where X is approximately equal to the width W) is therefore much less inductive than a long one (i.e. where X is much larger than the width W). Since structure 10 is preferably constructed out of a plurality of conductive planes of substantial X and W dimension (in comparison to the H dimension), structure 10 has an extremely low inductance while maintaining a high decoupling capacitance over its area. It should be noted that this advantage is optimized when structure 10 is implemented using thin film electrode and dielectric layers (i.e. where the separation distance H will be in the submicron range), in contrast to thick film (where the separation distance H is greater than 10 microns), or printed circuit board (where the separation distance H is greater than 100 *microns*).

Further, since electrode and dielectric layers 18a, 18b to 24a, 24b are all preferably made of thin film, the power and ground planes of structure 10 are arranged close to each other, and accordingly the mutual inductance generated between power and ground planes is increased (reducing the overall inductance $L_{\mathit{eff}}$). Further, in the preferred embodiment of structure 10, where every other opening is either a power node contact 47 or a ground node contact 49 as will be further described, mutual inductance of the staircase openings 25 that couple the power and ground planes to integrated circuit 80 is further increased. Also, since the power and ground electrodes of structure 10 are positioned substantially close to the power supply and ground nodes 82, 84 of integrated circuit 80 and are electrically connected using short power and ground wire interconnects 70a and 70b and flip-chip compact bump technology, the self inductance between the power and ground planes and integrated circuit 80 is reduced (further reducing the overall inductance $L_{\mathit{eff}}$). Thus, since the self inductance of the electrical path is reduced and the mutual inductance of the electrical path is increased, package 90 of FIG. 11 further decreases the overall effective impedance of the electrical path and likewise, the associated switching noise.

Finally, returning signal currents acting across the inductance of power distribution ground wiring, cause common-path noise voltages that affect the operation of the logic gates of an integrated circuit. For example, when logic gate $G_1$ or $G_2$ is in the HI state, the logic gate's output voltage will depend on the voltage at its power supply node. Any changes in the power voltage, caused by returning signal currents flowing in the power wiring, can directly affect the output voltage. As structure 10 presents low inductance to returning signal currents in both the power and ground planes and provides low-impedance paths between power and ground planes (through local decoupling capacitance $C_D$ and the mutual capacitance of the planes), low common-path noise will also result.

FIGS. 12A-1 and 12A-2 show a diagrammatic side and top view of a plurality of individual structures 10a, 10b, 10c and 10d, each individually flip-chip connected to the top surface of integrated circuit 80. In this arrangement, integrated circuit 80 contains multiple circuit blocks, each running on different power supplies ($V_{CC1}$, $V_{CC2}$, $V_{CC3}$, and $V_{CC4}$). In such a case, it is advantageous to use individually tailored structures 10a, 10b, 10c, and 10d to individually service and electrically isolate each circuit block. When the size of structure 10 is reduced, overall production yields are increased due to the reduced likelihood of defect occurrence within a particular structure 10 on a wafer.

Figures 1, 12B:
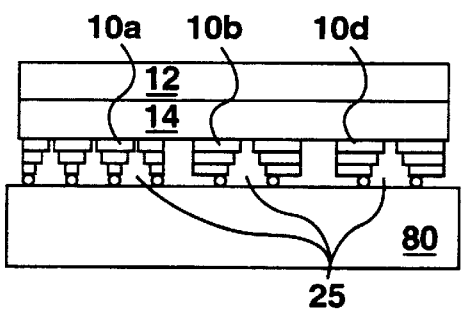
Figures 2, 12B:
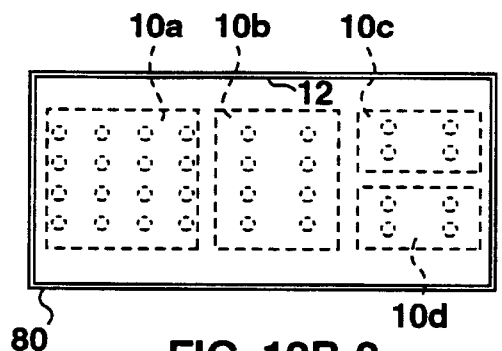

FIGS. 12B-1 and 12B-2 show a diagrammatic side and a top view of integrated circuit 80 coupled to a plurality of independent capacitance structures 10a, 10b, 10c, and 10d formed on a single substrate 12. Each capacitance structure 10a, 10b, 10c, and 10d is individually flip-chip connected to the top surface of integrated circuit 80. This arrangement is most useful in the case where integrated circuit 80 has multiple circuit blocks running on different power supplies ($V_{CC1}$, $V_{CC2}$, $V_{CC3}$, and $V_{CC4}$). Again, in such a case, it is advantageous to isolate each capacitance structure 10a, 10b, 10c, and 10d by segmentation of the structures 10a, 10b, 10c, and 10d on a single substrate 12.

Figures 1, 12C:
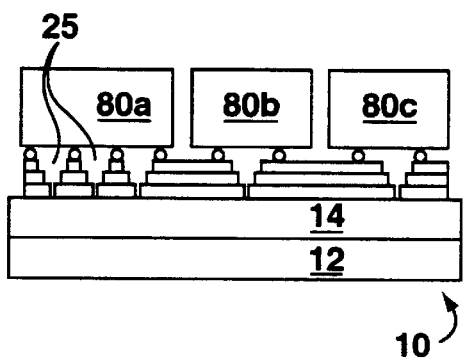
Figures 2, 12C:
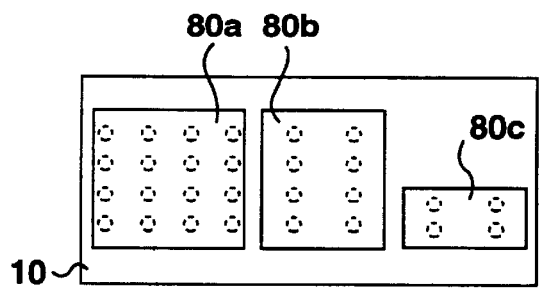

FIGS. 12C-1 and 12C-2 show a diagrammatic side and top view of a plurality of individual integrated circuits 80a, 80b, and 80c, each of which are individually flip-chip connected to the top surface of a single capacitance structure 10. It should be noted that this case the individual integrated circuits 80a, 80b, and 80c will all be running on the same power supply and are interconnected to one another. This arrangement provides the mechanical benefit of a single support structure 10.

PREFERRED METHOD OF FABRICATION

There are two general types of fabrication methods well known for film device structures. These methods are top-down and bottom-up fabrication. Top-down fabrication involves the deposition of a number of blanket film layers on a substrate, in sufficient number to make up the layers of the structure. Top-down patterning, using masks and etching, is then used to define the patterning of different layers. FIGS. 13A to 13E show top-down patterning used to produce the structure of FIGS. 1 and 2.

Figure 13A:
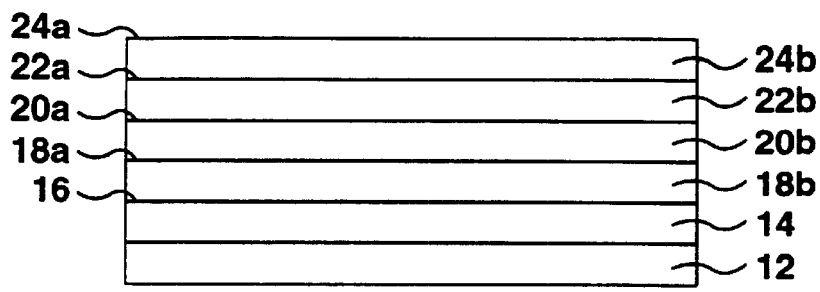
FIGS. 13A to 13E are diagrammatic views showing production of a distributed capacitance structure according to the invention by top-down patterning.
Figure 13B:
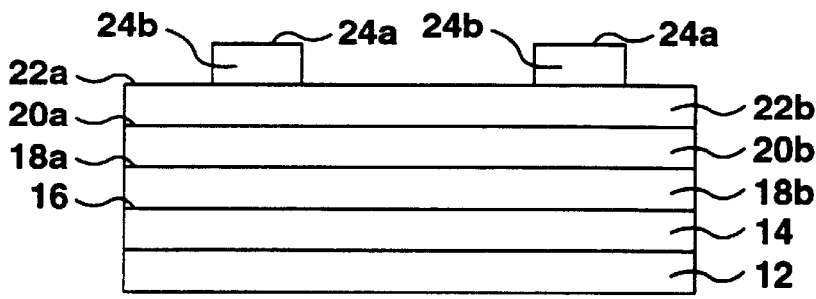

As shown in FIG. 13A, the electrodes and dielectric layers 16 and 18a, 18b to 24a, 24b are deposited in an unpatterned blanket structure 60 on the insulation layer 14 on the substrate 12. FIG. 13B shows the top electrode and dielectric layers 24a, 24b as being patterned (by known masking and etching techniques, as indicated).

Figure 13C:
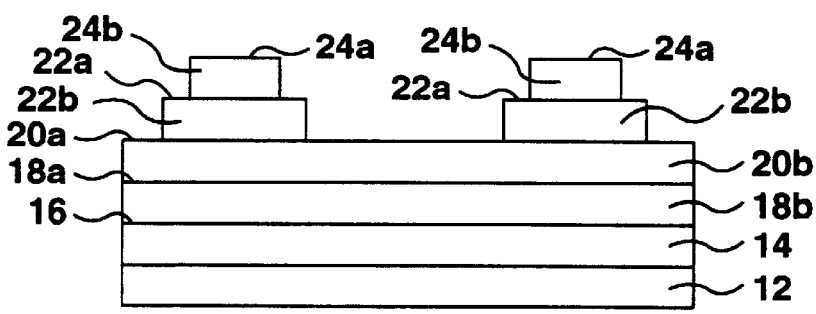
Figure 13D:
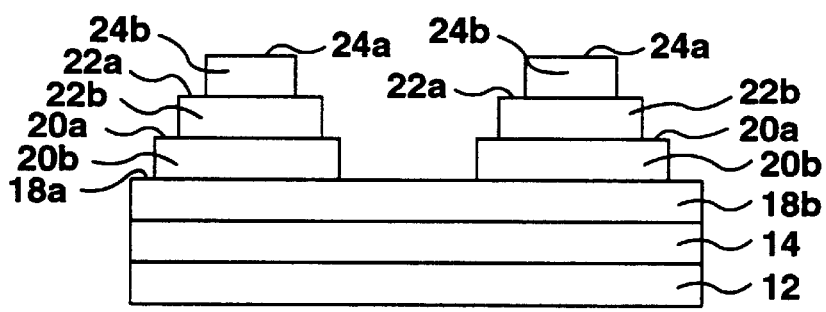
Figure 13E:
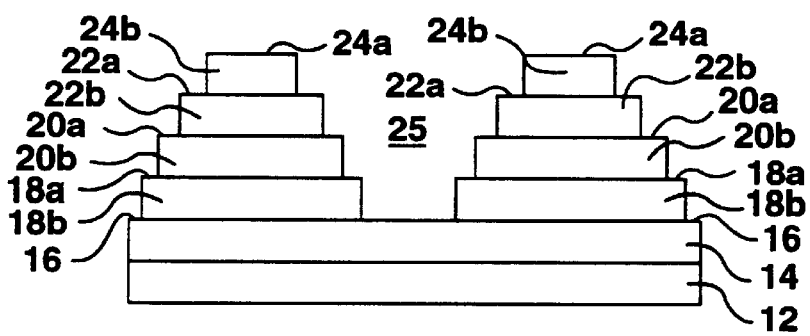

FIGS. 13C to 13E show successive patterning of successively lower layers of electrode and dielectric, until structure 10 having a single staircase opening 25 is achieved (FIG. 13E). It should be understood that even though only one staircase opening 25 is shown in profile, a plurality of staircase openings 25 can and usually will be formed within structure 10. After the bottom electrode 16 is patterned (not shown), the covering insulation layer 26 (not shown in FIG. 13E) is added.

It will be realized that with top-down patterning, it is not possible to pattern a lower layer to exclude area that exists in the pattern of any upper layer. This is not a problem when it is desired to produce structure 10 having a plurality of staircase openings 25 within. In addition, when etching is symmetrically performed on a layer of structure 10, all sides of the layer receive equal treatment, improving the predictability of the resultant structure.

Bottom-up fabrication builds a device structure one layer at a time, starting with the formation of the bottom layer. Several bottom-up fabrication methods are known. In one method, a layer can be fabricated by laying down a blanket and then patterning over it to subtract away undesired blanket material, after which the next layer is added. Alternatively, using a selective pattern deposition method, a lift-off or shadow mask can be used to form selectively the desired pattern of film on the substrate. In this method a lift-off mask is present on the substrate when the film is deposited; then the lift-off mask is removed, leaving the patterned film behind. The geometry of structure 10 as shown in FIGS. 1 and 2 can be fabricated using either top-down or bottom-up fabrication methods, but using top-down fabrication allows several important manufacturing advantages.

A major advantage of top-down fabrication, which is ideally suited for structure 10 having a plurality of staircase openings 25 as discussed, is that top-down fabrication occurs under conditions of topographical and chemical homogeneity. Since the structure does not have to be patterned as it is being laid down, each successive blanket film layer can be formed over an identical surface of a previous layer with uniform topographical and chemical properties. As a result, there are no lateral variations or transition regions present which can cause material incompatibilities. In the case of bottom-up fabrication, a film which nucleates and grows on two regions of a substrate having distinct topographical and chemical characteristics, may develop different properties over the different regions. In addition, the absence of topographical inhomogeneity in top-down construction (preferred for the staircase structure described) can also prevent the occurrence of film stresses and defects at transition edges and corners where deposited layers may be thinly formed.

Another advantage of top-down fabrication is that after unpatterned blanket layers have been deposited as shown in FIG. 13A, producing the standard blanket structure, custom staircase openings 25 can be fabricated therefrom as desired. One example of this is shown in FIG. 14A, where an unpatterned blanket structure 60, which can be a stock item, is shown. The unpatterned blanket structure 60 is then formed into a custom staircase opening array 64, having staircase openings 25a and 25b positioned to match a particular layout configuration of an integrated circuit (i.e. the openings 25a and 25b are positioned directly below the a power supply and ground nodes 82, 84 of each logic gate). The electrode layers 16 and 18a to 24a within staircase openings 25a and 25b are then wired as indicated at 66 using power and ground wire interconnects 70a and 70b to form the complete custom product. It should again be noted that identical wiring patterns must exist within each staircase opening 25 in order to ensure that structure 10 does not short.

Alternatively, and as shown in FIG. 14B, an unpatterned stock blanket structure 60 can be used to produce a stock staircase opening array 68, having a predetermined number of staircase openings 25a and 25b. The staircase opening array 68 can serve as a stock item, to be wired according to customer needs, with typical customized interconnect wiring being shown at 70 in FIG. 14B. It should be noted that since the positions of staircase openings 25a and 25b (among others) are predetermined within structure 10, customization of structure 10 can be effected by selecting particular staircase openings for interconnection to integrated circuit 80 (in this case, staircase opening 25b is electrically connected to a logic gate which is positioned directly above on integrated circuit 80 while staircase opening 25a is not used since there is no locally positioned logic gate).

The ability to produce stock staircase opening array forms, or to semi-customize them initially, can allow for shortened manufacturing lead time, and reduced inventory costs, resulting in improved efficiencies.

Even if bottom-up fabrication is used, nevertheless when structure 10 having a plurality of staircase openings 25 is being produced, all electrode and dielectric layers of structure 10 are formed over flat surfaces of the previous layer and are not formed over any topographical (vertical) steps. This is a significant advantage of structure, because since thin films require nucleation on depositing surfaces, it is more effective to deposit layers on a flat (horizontal) surface than over topographical steps. With the stepped structure of the staircase openings 25, only the protective or overcoat insulation layer 26 need be formed over topographical steps. Therefore, the resultant structure has a lower likelihood of chemical, mechanical and physical inhomogeneities than would occur if the layers were fabricated over a more varied topography.

It should also be appreciated that when customizing structure 10 is formed having predetermined staircase openings 25 (as illustrated in FIG. 14B), individual staircase openings 25 can be wired to either the power supply or ground nodes 82 or 84 of integrated circuit 80 (i.e. in a dedicated fashion). This arrangement can be adopted in the case where it is still desired to use the customizing structure 10 with predetermined staircase openings 25 (e.g. for cost and efficiency reasons) but where the packaging of integrated circuit 80 requires a particular spacing between its power supply and ground nodes that is larger than can be effectively accommodated within one staircase opening 25. For example, as shown in FIG. 15, staircase opening 25a only electrically connected to ground node 84 of integrated circuit 80 and staircase opening 25b only electrically connected to power supply node 82 of integrated circuit 80.

FURTHER APPLICATIONS AND EMBODIMENTS

Figure 16:
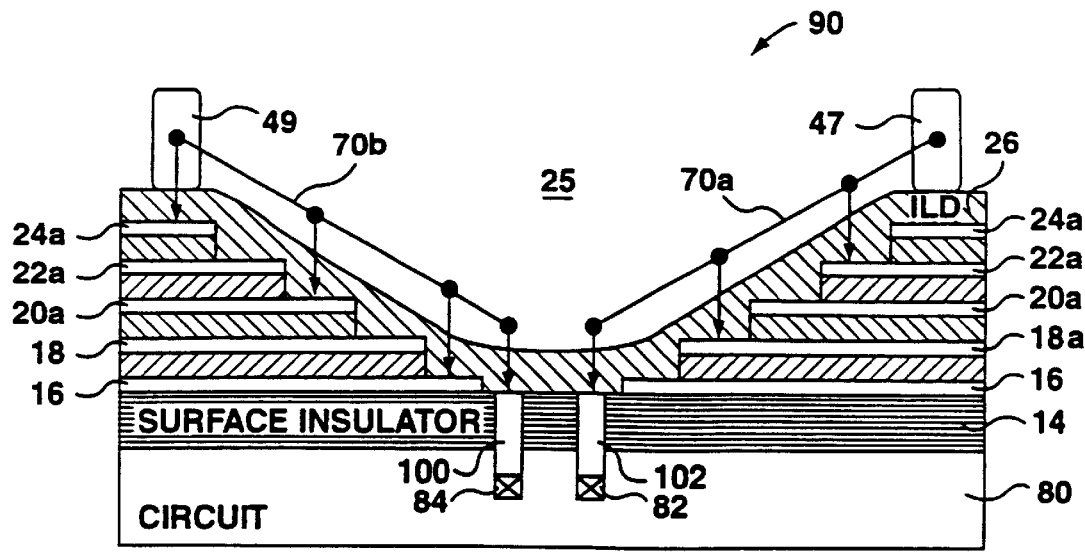
FIG. 16 is a diagrammatic side sectional view of the distributed capacitance structure of FIG. 1 having logic gate contacts mounted above the electrode and dielectric and top insulation layers and bottom terminals positioned below and extending beyond the bottom surface insulator to electrically connect the structure to an integrated circuit positioned directly below.

FIG. 16 is a diagrammatic side sectional view of an assembly 90 which incorporates structure 10. Power contact 47 and ground contact 49 are mounted above insulation layer 26 and bottom terminals 100 and 102 are positioned within, and extend beyond, insulation layer 14. As shown, ground contact 49 is electrically connected to electrode layers 24a, 20a, 16 and bottom terminal 100 through ground wire interconnect 70b and power contact 47 is electrically connected to electrode layers 22a, 18a and bottom terminal 102 through power wire interconnect 70a. Bottom terminals 100 and 102 can be used to electrically connect structure 10 with power supply and ground nodes 82, 84 of integrated circuit 80 positioned underneath insulator layer 14, as shown. Additionally, or alternatively, another integrated circuit 80 can be positioned above structure 10 (not shown) and connected to local staircase opening 25 of structure 10 through flip-chip contacts onto power contact 47 and ground contact 49.

Figure 17:
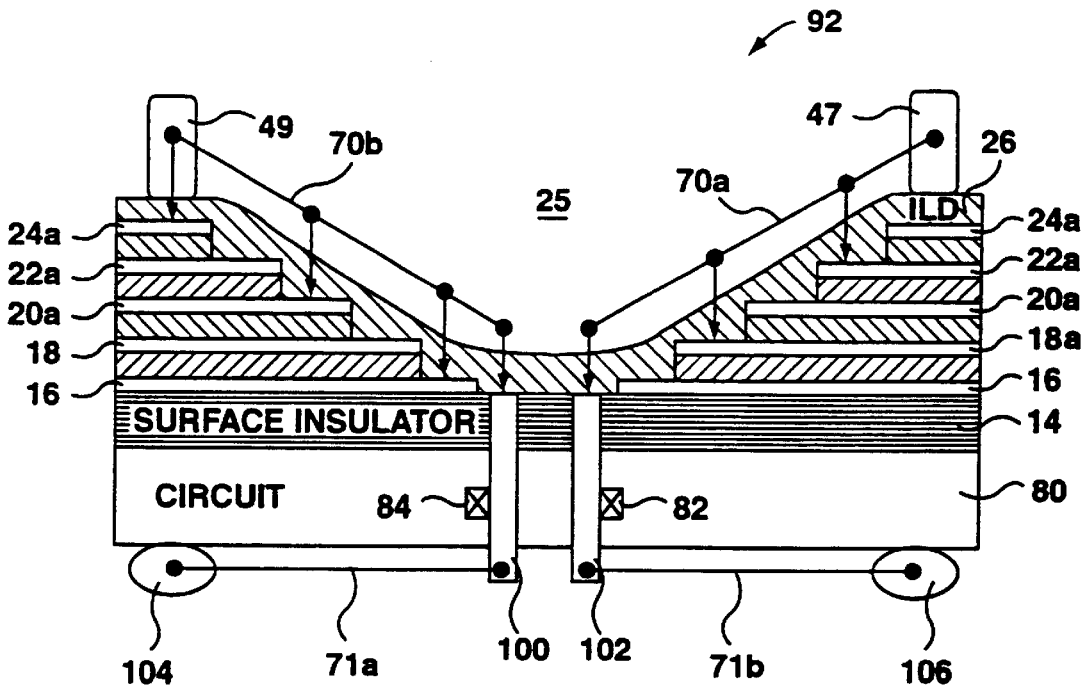
FIG. 17 is a diagrammatic side sectional view of the distributed capacitance structure of FIG. 16 having its bottom terminals extending past the integrated circuit within through-hole structures therein for use as a stacking assembly.

FIG. 17 is a diagrammatic side sectional view of a stackable assembly 92 in which power supply and ground nodes 82, 84 of integrated circuit 80 are coupled to selected electrode layers within local staircase opening 25 using power and ground wire interconnects 70a and 70b and bottom terminals 100 and 102. Bottom terminals 100 and 102 are positioned within through-holes formed within insulation layer 14 and integrated circuit 80 and can be electrically connected to a pair of power supply and ground nodes 82, 84 within integrated circuit 80 located at some point along the extent of terminals 100 and 102. Bottom terminal 100 is shown electrically connected to electrode layers 24a, 20a and 16 and bottom terminal 102 is electrically connected to electrode layers 22a and 18a. Gate contacts 104 and 106 are provided on the underside of integrated circuit 80 and are electrically connected to bottom terminals 100 and 102, respectively through wire interconnects 71a and 71b. Gate contacts 104 and 106 allow for the electrical connection of assembly 92 to another assembly 92 as will be described.

Figure 18:
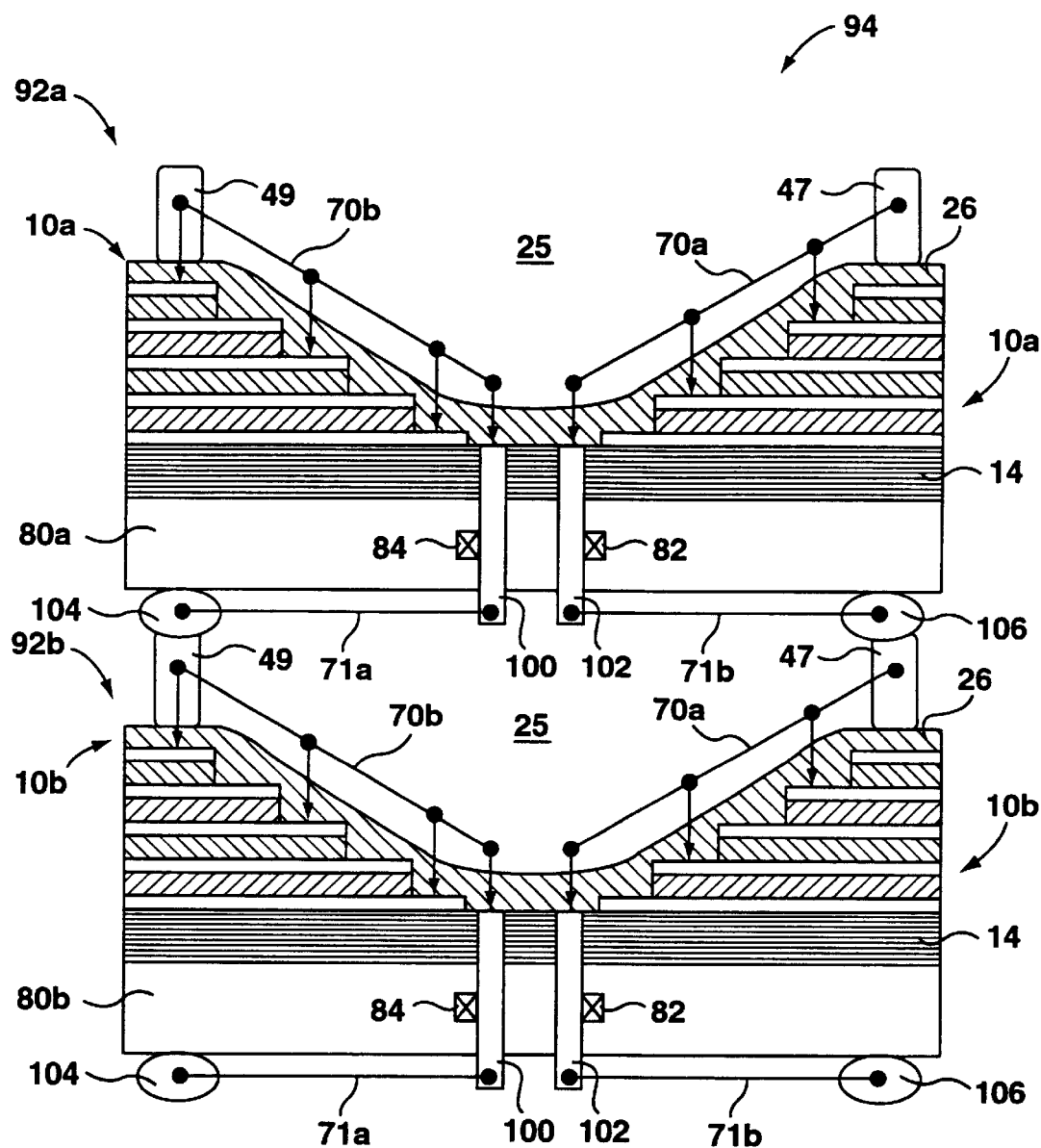
FIG. 18 is a diagrammatic side sectional view of two stacking assemblies of FIG. 17 in a front to back configuration.
Figure 19:
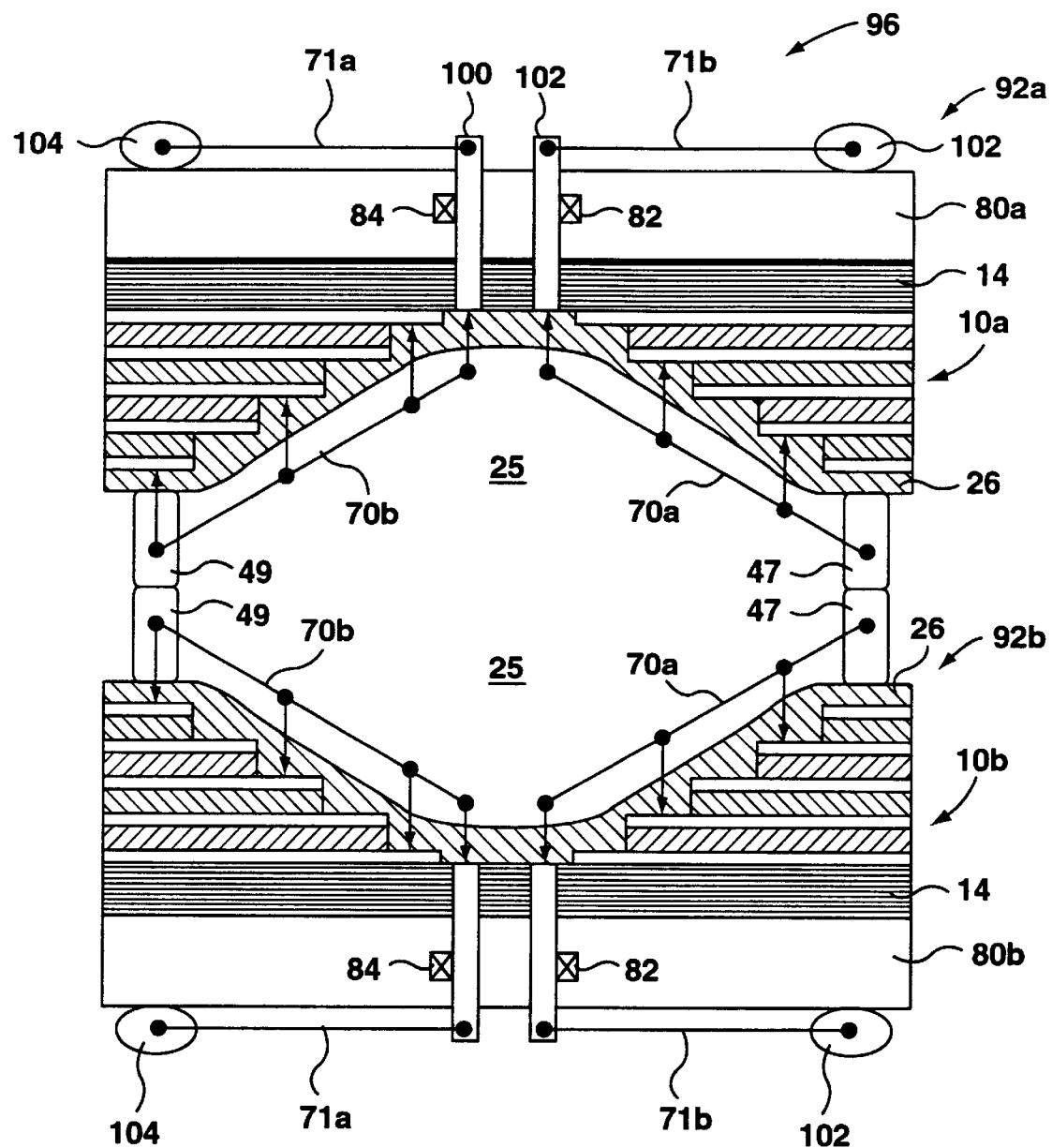
FIG. 19 is a diagrammatic side sectional view of two stacking assemblies of FIG. 17 in a front to front configuration.
Figure 20:
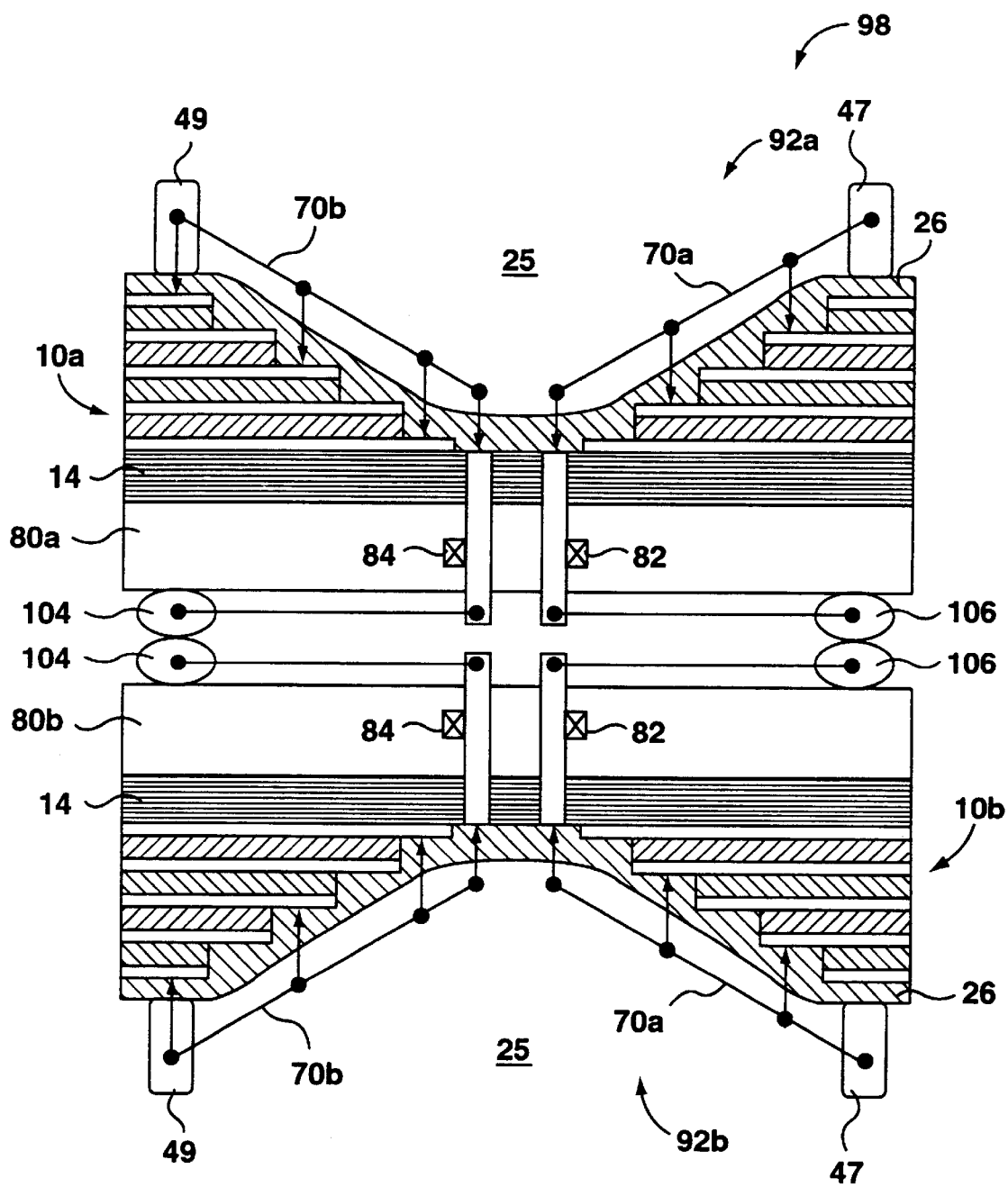
FIG. 20 is a diagrammatic side sectional view of two stacking assemblies of FIG. 17 in a back to back configuration.

FIGS. 18 to 20 illustrate several multi-level configurations contemplated by the invention utilizing two stackable assemblies 92a and 92b of the configuration discussed in respect of FIG. 17. In each configuration two integrated circuits 80a and 80b are electrically coupled to local staircase openings 25a and 25b of structures 10a and 10b, respectively. It should be understood that while various stacking configurations have been described for only two assemblies 92a and 92b, additional numbers of assemblies may be combined in a stacking formation to form other types of stacked unit configurations. Further, it should be understood that a conventional substrate 14 could be installed in place of integrated circuit 80 in assembly 92a and/or 92b, to provide a multi-layered distributed capacitive structure which can then be externally connected to one or more integrated circuits 80.

FIG. 18 shows a diagrammatic side sectional view of a stacking assembly 94 which incorporates two stackable assemblies 92a and 92b in a front to back configuration. Integrated circuits 80a and 80b are electrically coupled to structures 10a and 10b, respectively, using power and ground wire interconnects 70a and 70b and bottom terminals 100 and 102. Specifically, power wire interconnect 70a connects power contact 47 with electrode layers 22a, 18a and bottom terminal 102 and ground wire interconnect 70b connects ground contact 49 with electrode layers 24a, 20a, 16 and bottom terminal 100.

As before, bottom terminals 100 and 102 are positioned within appropriately dimensioned through-holes located in insulation layers 14 and integrated circuits 80a and 80b and are electrically connected to gate contacts 104 and 106 through wire interconnects 71a and 71b. Finally, assembly 92a and 92b are electrically connected to each other by the electrical connection of the power and ground contacts 47 and 49 of assembly 92b with the gate contacts 104 and 106 of assembly 92a, as shown.

FIG. 19 shows a diagrammatic side sectional view of a stacking assembly 96 which incorporates two stackable assemblies 92a and 92b in a front to front configuration by establishing electrical contact between the power and ground contacts 47, 49 of assembly 92a and the power and ground contacts 47,49 of assembly 92b, as shown.

FIG. 20 shows a diagrammatic side sectional view of a stacking assembly 98 which incorporates two stackable assemblies 92a and 92b in a back to back configuration by establishing electrical contact between the gate contacts 104 and 106 of assembly 92a and the gate contacts 104 and 106 of assembly 92b.

Figure 21:
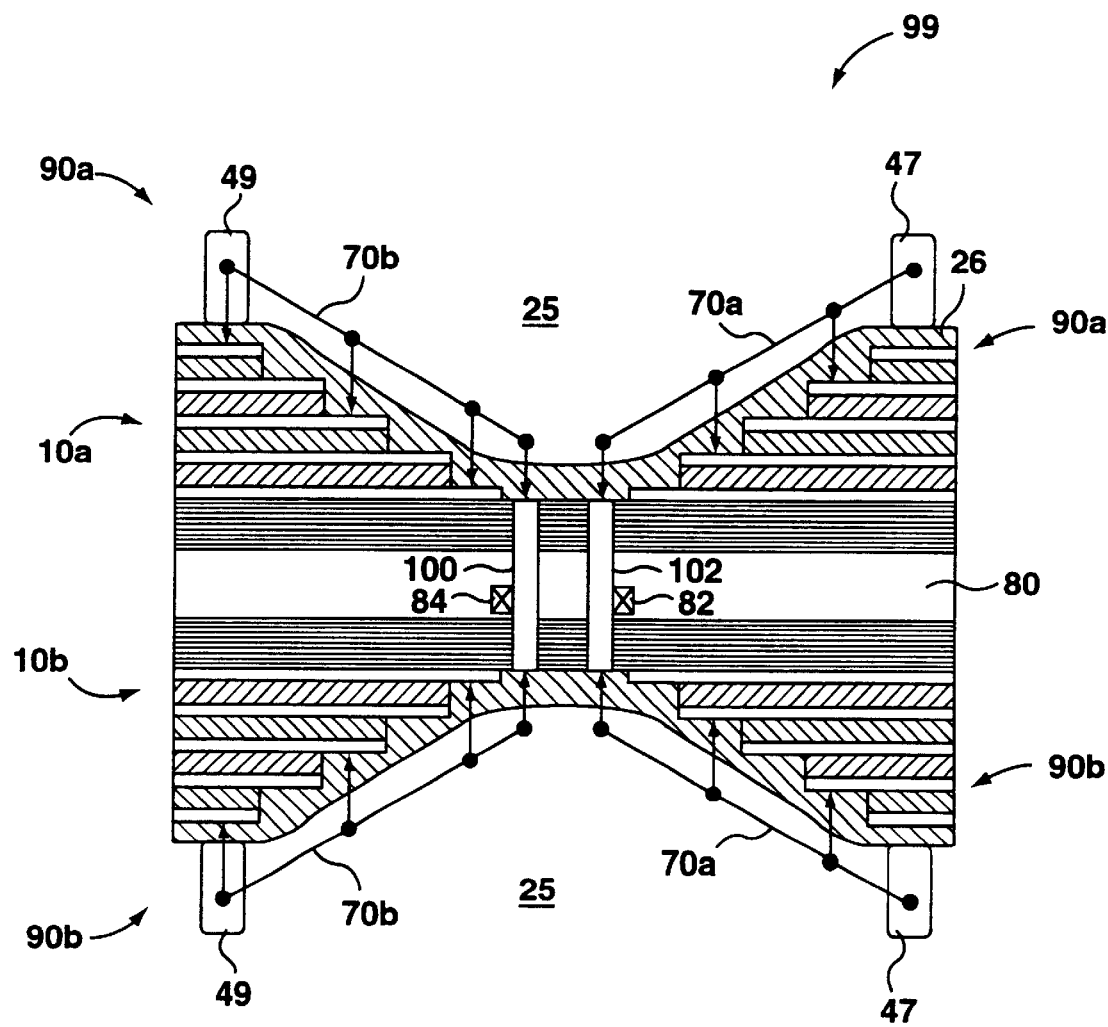
FIG. 21 is a diagrammatic side sectional view of two stacking assemblies of FIG. 16 in a back to back configuration wherein a single integrated circuit is electrically coupled to a distributed capacitive structure of FIG. 1 on its top and bottom surfaces.

FIG. 21 shows a diagrammatic side sectional view of a stacking assembly 99 which incorporates two stackable assemblies 90a and 90b of FIG. 16, in a back to back configuration wherein a single integrated circuit 80 is provided with structure 10a on one side and structure 10b on the other. This arrangement can be used to provide an increased capacitance across the power and ground nodes of the logic gates of integrated circuit 80.

Figure 22:
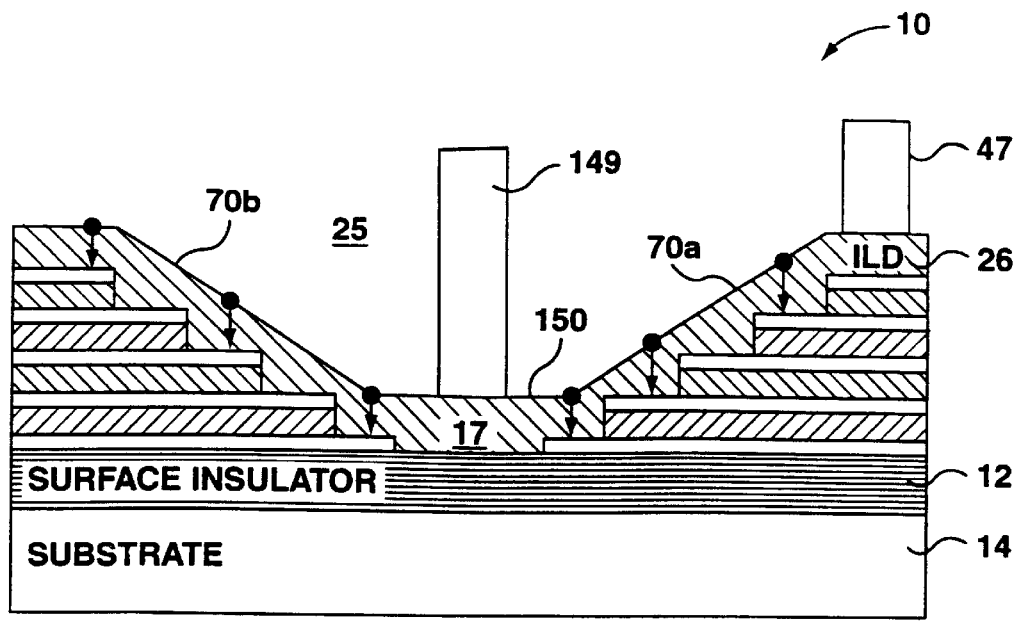
FIG. 22 is a diagrammatic side sectional view of the distributed capacitance structure having an extended ground terminal centred within a staircase opening directly over the bottom electrode opening to increase the mechanical stability of the structure.

FIG. 22 is a diagrammatic side sectional view of structure 10 having an extended ground contact 149 positioned in the center of a staircase opening 25. As shown, ground wire interconnect 70b is extended over electrode layer opening 17 to form a contact pad 150 on which extended ground contact 149 can be electrically installed. Since staircase opening 25 physically shields extended ground contact 149 from physical damage which may occur during use of structure 10, the mechanical stability of the structure is increased. It should be understood that power contact 47 could alternatively be formed as an extended power contact in place of extended ground contact 149 in association with the original ground contact 49, if desired.

Figure 23:
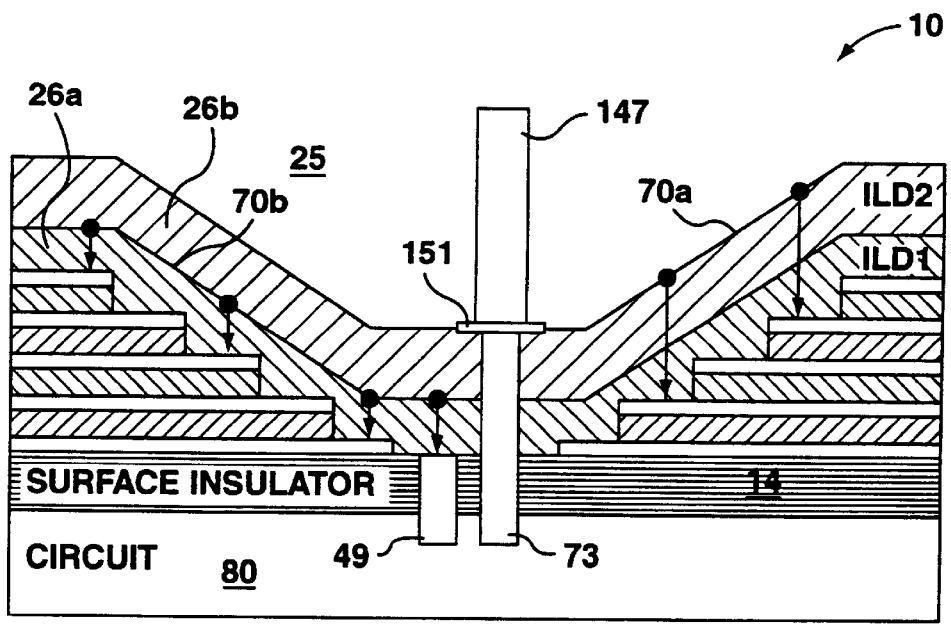
FIG. 23 is a diagrammatic side sectional view of the distributed capacitance structure of FIG. 22, having a ground terminal and an extended power terminal positioned within and extending beyond the bottom insulator layer to make electrical contact with the power supply and ground nodes of an integrated circuit positioned directly below.

FIG. 23 is a diagrammatic side sectional view of distributed capacitance structure 10, where ground contact 49 is positioned below insulator layer 14 and where an extended power contact 147 is positioned on top of power wire interconnect 70a on a contact pad 151. It is necessary to provide two layers of insulation 26a and 26b, in order to electrically isolate power wire interconnect 70a from ground wire interconnect 70b, as shown. Further, ground wire interconnect 70b is electrically connected to ground contact 49 through and past insulator 14 into integrated circuit 80. Extended power contact 147 is electrically connected to substrate contact 73 which is formed within insulation layers 26a and 26b and insulation 14 to make electrical contact with integrated circuit 80.

This configuration allows electrical contact to be made between structure 10 and the power and ground nodes of the logic gates within integrated circuit 80 positioned directly below structure 10. Further, since both power and ground contacts 47, 49 are repositioned away from the top surface of structure 10 and within the shielding recesses of staircase openings 25 of structure 10, this configuration further increases the mechanical stability of the structure over that depicted in FIG. 22.

Figure 24A:
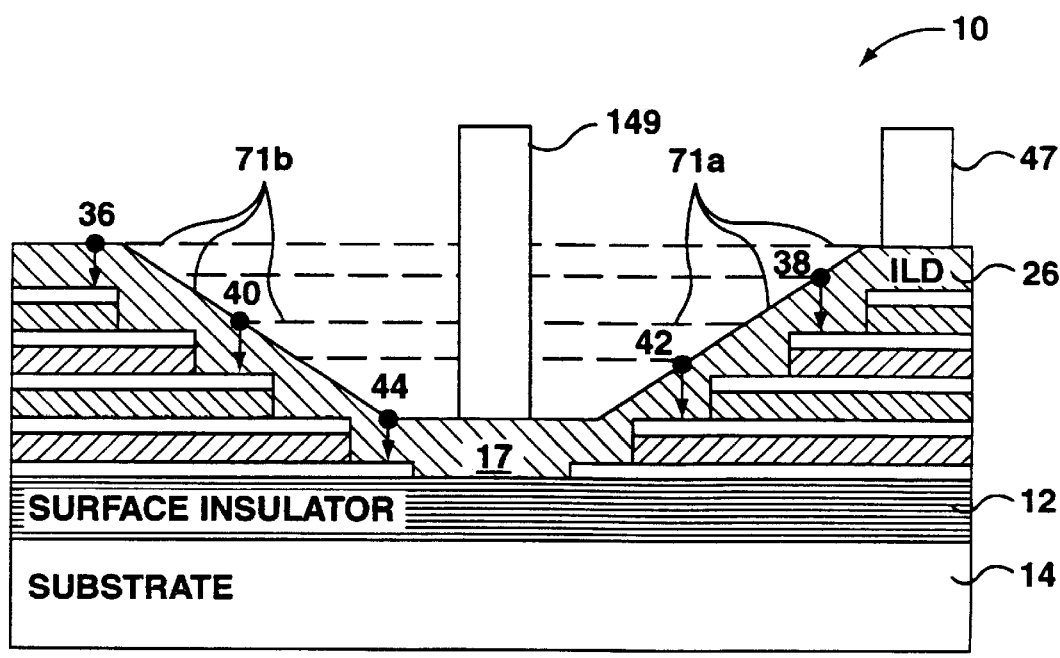
FIG. 24A is a diagrammatic side sectional view of the distribute capacitance structure of FIG. 22 having power and ground wire networks which extend along, and provide electrical connection to, the horizontal ledge surfaces of the various connected electrode layers.
Figure 24B:
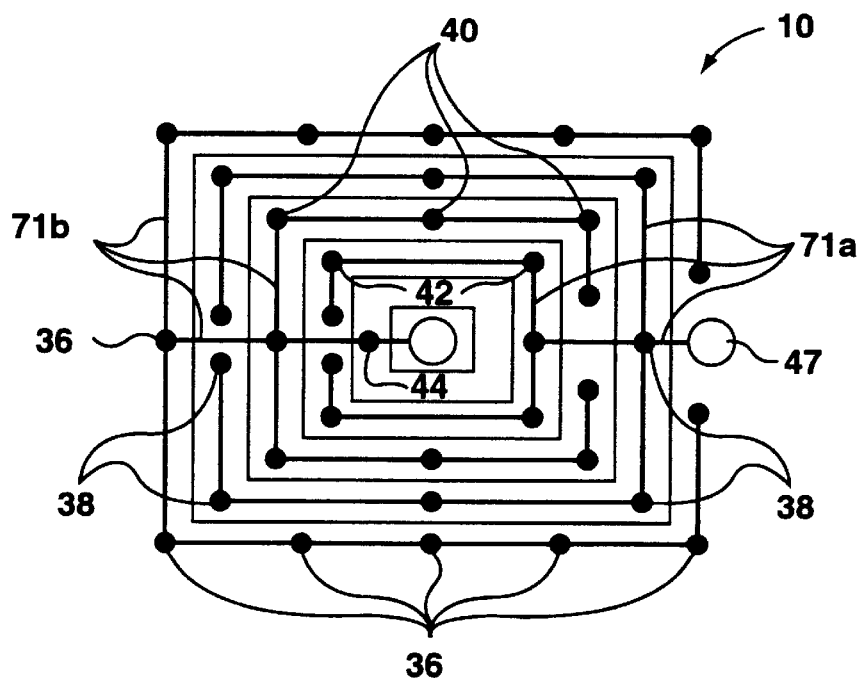
FIG. 24B is a diagrammatic top view of the distributed capacitance structure of FIG. 24A.

FIGS. 24A and 24B are diagrammatic side sectional and top views of structure 10 of FIG. 22 wherein a power wire network 71a and a ground wire network 71b are used in place of power and ground wire interconnects 70a and 70b. Power and ground wire networks 71a and 71b extend along the horizontal ledges surfaces of selected electrode layers 18a to 24a and electrically connect a plurality of contacts along each particular electrode layer. As shown, extended ground contact 149 is centred within a staircase opening directly over bottom electrode layer opening 17 and power contact 47 is positioned on top of insulator 26.

Specifically, power wire network 71a electrically connects power contact 47 to contacts 38 and 42 on electrode layers 22a and 18a, respectively and ground wire network 71b electrically connects extended ground contact 149 to contacts 44, 40, and 36 on electrode layers 16, 20a, and 24a, respectively. It should be noted that multiple contacts 36, 38, 40, 42, and 44 are made around the extent of the ledge of the appropriate exposed electrode layers, as shown. The use of power and ground wire networks 71a and 71b reduces current density by a factor of between 4 to 6 times.

Where only one contact point is used to each electrode layer, high density transient current is provided at the point of contact. Due to the presence of spreading resistance, this high density transient current will only be able to penetrate limited areas of the exposed electrical layers of structure 10 and reduced effective decoupling capacitance will result. It is contemplated that since transient current is only provided to two out of the four possible ledge surfaces of each electrode layer (i.e. in the case of square staircase openings 25 and wiring configuration of FIGS. 1 and 2), as much as half the potential capacitance of structure 10 can be lost if spreading resistance is significant.

It should be understood that while the use of additional power and ground wire networks 71a and 71b introduces additional inductance to the electrical path of structure 10, the current level flowing through the arms of networks 71a and 71b is also proportionally reduced (e.g. approximately 4 to 6 times) in compensation. By providing power and ground wire networks 71a and 71b, it is possible to distribute the current around the ledge surfaces of electrode layers 18a to 24a and to increase the penetration of the current within the electrode and dielectric layers of structure 10 for a net advantage.

It should be understood that dielectric layers 18b, 20b, 22b, 24b between the respective sets of electrode layers can be made to differ from each other in their response to the frequency of the applied electric field. It is well-known that the dielectric constant of many known dielectric materials varies with frequency, and typically drops off sharply as the frequency increases beyond a rolloff frequency (when the frequency is higher than such rolloff frequency, the material is unable to store additional energy).

Examples of materials which display this characteristic include members of the lead zirconate titanate (PZT) family, members of the barium strontium titanate (BST) family, silicon dioxide, and silicon nitride. Further, the characteristics of each capacitor layer can be varied by making the thicknesses of dielectric layers 18b, 20b, 22b, 24b different from each other (e.g. so that each layer has a different capacitance value). The difference in capacitances of the various layers can also be controlled by using dielectric materials having higher dielectric constant and/or by using thinner dielectric layers.

Also, while it is preferred that structure 10 be fabricated using thin film technology, it should be understood that structure 10 could also be fabricated using thick film technology. Specifically, structure 10 could be built using thick film printing and punching techniques to produce prepatterned layers of thick film which are then placed in an appropriate configuration to form structure 10. It should be noted that achieving proper alignment of the layers within structure 10 will generally be difficult, due to the poor tolerances of thick film edges.

Finally, while structure 10 has been described in association with digital circuitry it should be understood that structure 10 could alternatively be used in association with any circuit which requires connection to a distributed capacitor.

One practical requirement of such an implementation is that it requires fabrication of dielectric film layers of different compositions and properties in close association with each other. The annealing temperature must therefore be adapted to accommodate the most temperature sensitive layer of material. If necessary, such a structure can be fabricated by a bottom-up technique, in which the bottom layers are those which require the highest temperature annealing and are laid down first. Layers which require and will withstand only lower temperature annealing can then be laid down above the higher annealing temperature layers and annealed after the higher temperature layers have been annealed.

While preferred embodiments of the invention have been described, it will be appreciated that various changes can be made within the scope of the appended claims.

I claim:

1. A multi-layer distributed capacitance structure comprising:
   (a) a substrate, and a bottom electrode layer overlying said substrate,
   (b) at least one pair of intermediate layers of an electrode and a dielectric material overlying said bottom electrode,
   (c) a top pair of layers of an electrode and a dielectric material overlying the uppermost pair of intermediate layers,
   (d) a plurality of openings in said structure, each opening extending from said top pair of layers and through at least one pair of said intermediate layers, at least some of said openings penetrating all of said pairs of intermediate layers,
   (e) each opening having a sidewall, at least a portion of said sidewall having an inwardly and downwardly stepped configuration in said opening so that at least some of said layers of electrodes in said openings have edge portions in said openings that are not covered by an electrode layer thereabove, and
   (f) at least some of said edge portions being adapted to be connected to a circuit.

2. A capacitance structure according to claim 1 wherein at least some of said openings extend through said bottom electrode.

3. A capacitance structure according to claim 1 wherein in at least some of said openings, said sidewall has said stepped configuration around its entire perimeter.

4. A capacitance structure according to claim 3 wherein at least some of said openings are of square configuration in plan.

5. A capacitance structure according to claim 3 wherein at least some of said openings are of circular configuration in plan.

6. A capacitance structure according to claim 1, 2 or 3 and having at least one outside edge, at least a portion of said outside edge being of downwardly and outwardly stepped configuration such that at least some of said electrode layers have outside edge portions that are not covered by an electrode layer thereabove, said outside edge portions being adapted to be connected to a circuit.

7. A capacitance structure according to claim 1, wherein each said pair of intermediate layers extends laterally beyond and around the entire periphery of said intermediate and top layers thereabove and said bottom electrode layer extends laterally beyond and around the entire periphery of said plurality of intermediate and top layers thereabove, such that said electrode layer in each said opening has edge portions which are not covered by an electrode layer thereabove and such that each said sidewall in each said opening has a stepped configuration around its entire perimeter.

8. A capacitance structure according to claim 1, wherein there are a plurality of pairs of intermediate layers.

9. A capacitance structure according to claim 1, 2 or 3, wherein at least some of said edge portions are adapted to be electrically connected to at least one of a power supply node and a ground node of an integrated circuit logic gate such that none of said bottom, intermediate and top electrode layers are electrically connected to both said power supply node and said ground node of said integrated circuit logic gate.

10. A capacitance structure according to claim 1 wherein said dielectric material is a ferroelectric material.

11. A capacitance structure according to claim 1 wherein said electrode and dielectric layers are thin film layers.

12. A capacitance structure according to claim 1 wherein at least some of said dielectric layers have dielectric constants different from the dielectric constants of other said dielectric layers.

13. A capacitance structure according to claim 1 wherein at least some of said dielectric layers have different frequency response characteristics from the frequency response characteristics of other said dielectric layers.

14. A capacitance structure according to claim 1, 2 or 3, and being formed by deposition of said electrode and dielectric material layers on said substrate, and then by top-down patterning of said electrode and dielectric material layers to form said plurality of openings within said capacitance structure.

* * * * *